United States Patent
Tomizawa et al.

(10) Patent No.: US 11,499,005 B2
(45) Date of Patent: Nov. 15, 2022

(54) CURABLE COMPOSITION, PREPREG, RESIN SHEET, METAL FOIL-CLAD LAMINATE AND PRINTED WIRING BOARD

(71) Applicant: MITSUBISHI GAS CHEMICAL COMPANY, INC., Tokyo (JP)

(72) Inventors: Katsuya Tomizawa, Tokyo (JP); Mayumi Kikuchi, Tokyo (JP); Hidetoshi Kawai, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 17/262,872

(22) PCT Filed: Jul. 11, 2019

(86) PCT No.: PCT/JP2019/027496
§ 371 (c)(1),
(2) Date: Jan. 25, 2021

(87) PCT Pub. No.: WO2020/022084
PCT Pub. Date: Jan. 30, 2020

(65) Prior Publication Data
US 2021/0261722 A1    Aug. 26, 2021

(30) Foreign Application Priority Data

Jul. 26, 2018 (JP) ............... JP2018-140494

(51) Int. Cl.
| | | |
|---|---|---|
| *B32B 27/02* | (2006.01) | |
| *C08G 59/62* | (2006.01) | |
| *B32B 5/26* | (2006.01) | |
| *C08J 5/24* | (2006.01) | |
| *B32B 5/02* | (2006.01) | |
| *C08G 59/30* | (2006.01) | |
| *C08K 3/36* | (2006.01) | |
| *C08K 5/315* | (2006.01) | |
| *C08K 5/3415* | (2006.01) | |
| *C08L 63/00* | (2006.01) | |
| *H05K 1/03* | (2006.01) | |

(52) U.S. Cl.
CPC ......... *C08G 59/621* (2013.01); *B32B 5/024* (2013.01); *B32B 5/263* (2021.05); *C08G 59/306* (2013.01); *C08J 5/244* (2021.05); *C08K 3/36* (2013.01); *C08K 5/315* (2013.01); *C08K 5/3415* (2013.01); *C08L 63/00* (2013.01); *H05K 1/0373* (2013.01); *B32B 2255/02* (2013.01); *B32B 2255/205* (2013.01); *B32B 2260/021* (2013.01); *B32B 2260/046* (2013.01); *B32B 2262/101* (2013.01); *B32B 2307/206* (2013.01); *B32B 2457/08* (2013.01); *C08J 2363/00* (2013.01)

(58) Field of Classification Search
CPC .......... C08L 63/00; C08L 83/06; C08K 5/13; C08K 3/36; C08K 5/315; C08K 5/3415; B32B 15/14; B32B 15/20; B32B 2250/40; B32B 2255/02; B32B 2255/205; B32B 2260/021; B32B 2260/046; B32B 2262/02; B32B 2262/0269; B32B 2262/0276; B32B 2262/10; B32B 2262/101; B32B 2262/14; B32B 2264/10; B32B 2264/101; B32B 2264/102; B32B 2264/104; B32B 2264/108; B32B 2264/12; B32B 2307/202; B32B 2307/206; B32B 2307/714; B32B 2307/732; B32B 2307/734; B32B 2457/08; B32B 27/12; B32B 5/022; B32B 5/024; B32B 5/028; B32B 5/08; B32B 5/26; B32B 5/263; C08G 59/226; C08G 59/306; C08G 59/621; C08G 77/14; C08J 2363/00; C08J 2383/06; C08J 5/244; H05K 1/0353; H05K 1/0366; H05K 1/0373; H05K 3/022
See application file for complete search history.

(56) References Cited

U.S. PATENT DOCUMENTS

| | | |
|---|---|---|
| 5,659,004 A | 8/1997 | Takigawa et al. |
| 2014/0023839 A1 | 1/2014 | Wang et al. |

FOREIGN PATENT DOCUMENTS

| | | |
|---|---|---|
| CN | 103540101 A | 1/2014 |
| CN | 106633675 A | 5/2017 |
| JP | 04-004213 A | 1/1992 |
| JP | 4-314723 A | 11/1992 |
| JP | 6-136093 A | 5/1994 |
| JP | 2012-149154 A | 8/2012 |

OTHER PUBLICATIONS

International Search Report issued in International Patent Application No. PCT/JP2019/027496, dated Sep. 17, 2019, along with an English translation thereof.
Written Opinion of the International Searching Authority issued in International Patent Application No. PCT/JP2019/027496, dated Sep. 17, 2019, along with an English translation thereof.

*Primary Examiner* — Lawrence D Ferguson
(74) *Attorney, Agent, or Firm* — Greenblum & Bernstein, P.L.C.

(57) ABSTRACT

A curable composition containing an alkenyl phenol A, an epoxy-modified silicone B, and an epoxy compound C other than the epoxy-modified silicone B.

31 Claims, No Drawings

CURABLE COMPOSITION, PREPREG, RESIN SHEET, METAL FOIL-CLAD LAMINATE AND PRINTED WIRING BOARD

TECHNICAL FIELD

The present invention relates to a curable composition, a prepreg, a resin sheet, a metal foil-clad laminate, and a printed wiring board.

BACKGROUND ART

In recent years, as semiconductor packages widely used in electronic devices, communication devices, personal computers, and the like are advanced in function and reduced in size, high integration and high density packaging of each component for semiconductor packages are acceleratingly advancing in recent years. Accordingly, requirement for various properties of printed wiring boards for semiconductor packages are increasingly stringent. Examples of such properties required for the printed wiring boards include low thermal coefficient of thermal expansion, chemical resistance, and peel strength.

Patent Document 1 discloses that a thermosetting resin composition containing a specific maleimide compound, a silicone compound having an epoxy group in a molecular structure, and a compound having a phenolic hydroxyl group is excellent in heat resistance and low thermal expansion and is suitably used in metal foil-clad laminates and multilayer printed wiring boards.

Patent Document 2 discloses a production method for obtaining a semiconductor sealing resin by reacting a polymaleimide, an addition polymer of a diglycidyl polysiloxane represented by Formula (I) below and a diallyl bisphenol represented by Formula (II) below, and an allylated phenolic resin represented by Formula (III) below at a predetermined proportion under a predetermined condition. Patent Document 2 discloses that the semiconductor sealing resin obtained by the production method described above has good miscibility between the polymaleimide and the addition polymer described above, and furthermore, a composition in which the semiconductor sealing resin is used provides a cured product having excellent properties (e.g., high glass transition temperature, moisture resistance, and strength when heated) and thus is highly reliable as a semiconductor sealing resin composition. Patent Document 2 discloses that a component b in Formula (III) below is an important component, which reacts with a maleimide group in a resin forming reaction with the polymaleimide and improves the miscibility between the polymaleimide and the polysiloxane.

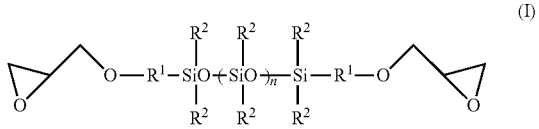

where $R^1$ represents an alkylene group or a phenylene group, each $R^2$ independently represents an alkyl group or a phenyl group, and n represents an integer from 1 to 100.

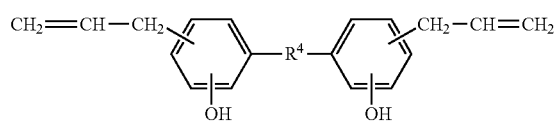

where $R^4$ represents an ether bond, a methylene group, a propylidene group, or a direct bond (single bond).

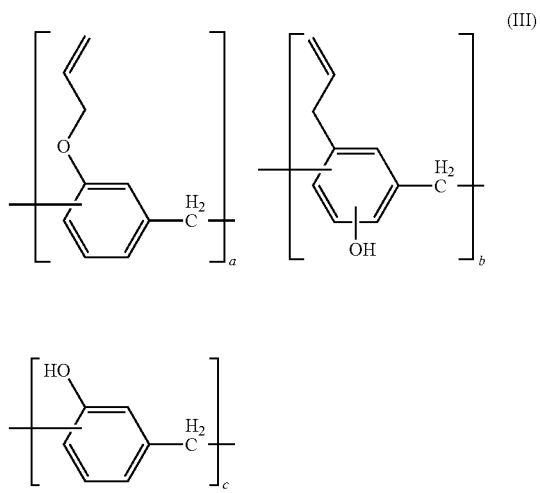

where, in the formula above, a, b, and c each represent a percentage of each component, 0< a, b, c<100, and a+b+c=100.

CITATION LIST

Patent Document

Patent Document 1: JP 2012-149154 A
Patent Document 2: JP 04-004213 A

SUMMARY OF INVENTION

Technical Problem

As described in Patent Document 1, a resin composition containing a silicone compound having an epoxy group in a molecular structure and a thermosetting resin, such as a maleimide compound, has excellent low thermal expansion. However, the present inventors have found that insufficient miscibility between the silicone compound and the thermosetting resin in the resin composition causes a problem in moldability of the resin composition. Furthermore, the present inventors have found that the resin composition has insufficient chemical resistance, and insufficient metal foil peel strength (e.g., copper foil peel strength) when formed into a metal foil-clad laminate.

On the other hand, the resin composition described in Patent Document 2 is used for semiconductor sealing and has not been examined for low thermal expansion, chemical resistance, and copper foil peel strength required as properties of printed wiring board.

The present invention has been made in view of the above problems, and an object of the present invention is to provide a curable composition, a prepreg, a resin sheet, a metal foil-clad laminate, and a printed wiring board having excellent miscibility, low thermal expansion, and chemical resistance.

Solution to Problem

The present inventors have diligently studied to solve the above problems. As a result, the present inventors have found that a curable composition containing an alkenyl phenol, an epoxy-modified silicone, and an epoxy compound other than the epoxy-modified silicone, or a curable composition containing a polymer having these as constituent units can solve the above problems, and completed the present invention.

That is, the present invention is as follows.

(1)
A curable composition containing:
an alkenyl phenol A, an epoxy-modified silicone B, and an epoxy compound C other than the epoxy-modified silicone B.

(2)
The curable composition according to (1), wherein
an average number of phenolic groups per molecule of the alkenyl phenol A is 1 or larger and less than 3, an average number of epoxy groups per molecule of the epoxy-modified silicone B is 1 or larger and less than 3, and an average number of epoxy groups per molecule of the epoxy compound C is 1 or larger and less than 3.

(3)
The curable composition according to (1) or (2), wherein
the alkenyl phenol A contains a diallyl bisphenol and/or a dipropenyl bisphenol.

(4)
The curable composition according to any one of (1) to (3), wherein
the epoxy-modified silicone B contains an epoxy-modified silicone having from 140 to 250 g/mol of an epoxy group mol equivalent.

(5)
The curable composition according to any one of (1) to (4), wherein
the epoxy-modified silicone B contains an epoxy-modified silicone represented by Formula (1) below:

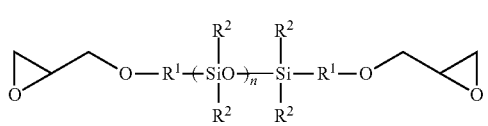

(1)

where each $R^1$ independently represents an alkylene group, a phenylene group, or an aralkylene group; each $R^2$ independently represents an alkyl group having from 1 to 10 carbon atoms, or a phenyl group; and n represents an integer of 1 or larger.

(6)
The curable composition according to any one of (1) to (5), wherein
the epoxy compound C contains an epoxy compound represented by Formula (2) below:

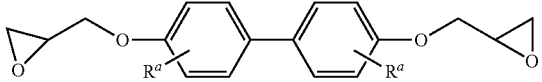

(2)

where each $R^a$ independently represents an alkyl group having from 1 to 10 carbon atoms, or a hydrogen atom.

(7)
The curable composition according to any one of (1) to (6), wherein
a content of the epoxy compound C is from 5 to 50 mass % based on a total amount of 100 mass % of the epoxy-modified silicone B and the epoxy compound C.

(8)
A curable composition containing:
a polymer D containing a constituent unit derived from the alkenyl phenol A, a constituent unit derived from the epoxy-modified silicone B, and a constituent unit derived from the epoxy compound C.

(9)
The curable composition according to (8), wherein
a weight average molecular weight of the polymer D is from $3.0 \times 10^3$ to $5.0 \times 10^4$.

(10)
The curable composition according to (8) or (9), wherein
a content of the constituent unit derived from the epoxy-modified silicone B in the polymer D is from 20 to 60 mass % based on a total mass of the polymer D.

(11)
The curable composition according to any one of (8) to (10), wherein
an alkenyl group mol equivalent of the polymer D is from 300 to 1500 g/mol.

(12)
The curable composition according to any one of (8) to (11), wherein
a content of the polymer D is from 5 to 50 mass % based on 100 mass % of resin solids.

(13)
The curable composition according to any one of (1) to (12),
further containing a thermosetting resin E.

(14)
The curable composition according to (13), wherein
the thermosetting resin E contains one or more selected from the group consisting of a maleimide compound, a cyanate ester compound, a phenolic compound, an alkenyl-substituted nadimide compound, and an epoxy compound.

(15)
The curable composition according to (14), wherein
the maleimide compound contains one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, and maleimide compounds represented by Formula (3) below:

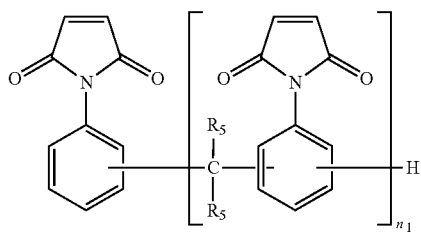

(3)

where each $R_5$ independently represents a hydrogen atom or a methyl group; and $n_1$ represents an integer of 1 or larger.

(16)

The curable composition according to (14) or (15), wherein the cyanate ester compound contains a compound represented by Formula (4) below and/or a compound represented by Formula (5) below excluding a compound represented by Formula (4) below:

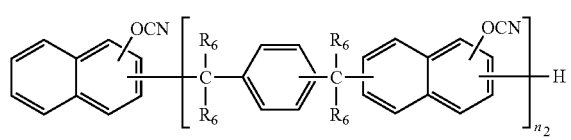

(4)

where each $R_6$ independently represents a hydrogen atom or a methyl group; and $n_2$ represents an integer of 1 or larger; and

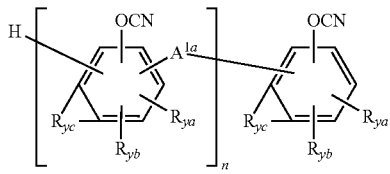

(5)

where each Rya independently represents an alkenyl group having from 2 to 8 carbon atoms; each Ryb independently represents an alkyl group having from 1 to 10 carbon atoms, or a hydrogen atom; and each Ryc independently represents an aromatic ring having from 4 to 12 carbon atoms, where Ryc may form a fused structure with a benzene ring, and Ryc may be present or absent; $A^{1a}$ represents an alkylene group having from 1 to 6 carbon atoms, an aralkylene group having from 7 to 16 carbon atoms, an arylene group having from 6 to 10 carbon atoms, a fluorenylidene group, a sulfonyl group, an oxygen atom, a sulfur atom, or a direct bond (single bond); when Ryc is absent, one benzene ring may have two or more groups of Rya and/or Ryb; and n represents an integer from 1 to 10.

(17)

The curable composition according to any one of (14) to (16), wherein the epoxy compound contains a compound represented by Formula (6) below or a compound represented by Formula (7) below:

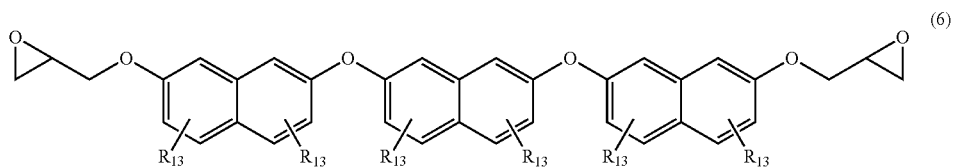

(6)

where each $R_{13}$ independently represents a hydrogen atom, an alkyl group having from 1 to 3 carbon atoms, or an alkenyl group having from 2 to 3 carbon atoms; and

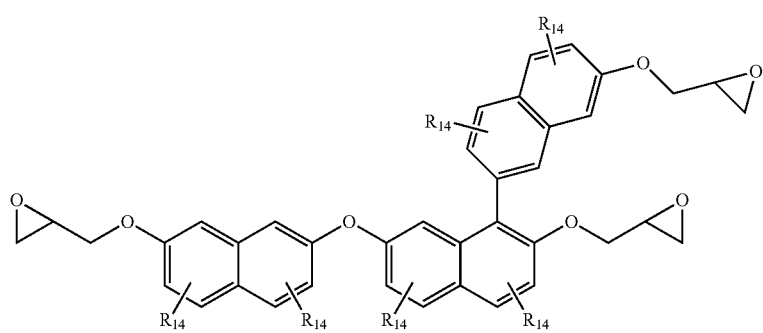

(7)

where each $R_{14}$ independently represents a hydrogen atom, an alkyl group having from 1 to 3 carbon atoms, or an alkenyl group having from 2 to 3 carbon atoms.

(18)

The curable composition according to any one of (1) to (17), further containing an inorganic filler, wherein a content of the inorganic filler is from 50 to 1000 parts by mass based on 100 parts by mass of resin solids.

(19)

The curable composition according to any one of (1) to (18), wherein the curable composition is used for a printed wiring board.

(20)

A prepreg including:

a base material; and the curable composition described in any one of (1) to (19) with which the base material is impregnated or coated.

(21)

A resin sheet including:

a support; and the curable composition described in any one of (1) to (19) disposed on a surface of the support.

(22)

A metal foil-clad laminate including:

a laminate formed of one or more selected from the group consisting of the prepreg described in (20) and the resin sheet described in (21); and a metal foil disposed on one or both sides of the laminate.

(23)

A printed wiring board including:

an insulating layer formed of one or more selected from the group consisting of the prepreg described in (20) and the resin sheet described in (21); and a conductor layer formed on a surface of the insulating layer.

Advantageous Effects of Invention

The present invention can provide a curable composition, a prepreg, a resin sheet, a metal foil-clad laminate, and a printed wiring board having excellent miscibility, low thermal expansion, and chemical resistance.

DESCRIPTION OF EMBODIMENTS

Hereinafter, embodiments of the present invention (hereinafter referred to as "the present embodiment") will be described in detail; however, the present invention is not limited to these embodiments, and various modifications may be made without departing from the scope and spirit of the invention.

Unless otherwise noted, "resin solids" as used in the present specification refers to components excluding a solvent and a filler in a curable composition of the present embodiment, and 100 parts by mass of resin solids means that a total amount of components excluding a solvent and a filler in the curable composition is 100 parts by mass.

"Miscibility" as used in the present specification refers to miscibility of a polymer D, which is a silicone component, with another thermosetting resin in the curable composition. Excellent miscibility prevents separation of the polymer D during molding, provides a molded body excellent in appearance, and in addition, provides excellent isotropy of physical properties of the resulting molded body.

First Embodiment

Curable Composition

A curable composition of the first embodiment contains an alkenyl phenol A, an epoxy-modified silicone B, and an epoxy compound C excluding the epoxy-modified silicone B (hereinafter also referred to simply as "the epoxy compound C"). The curable composition containing these components tends to have even better miscibility with a thermosetting resin that is not sufficiently miscible with the epoxy-modified silicone B. This enables the curable composition to exhibit even better miscibility. In addition, when a portion of each of these components is reacted (polymerized) and used, the curable composition can exhibit even better low thermal expansion and chemical resistance.

Alkenyl Phenol A

The alkenyl phenol A is not particularly limited as long as the compound has a structure in which one or more alkenyl groups are directly bonded to a phenolic aromatic ring. The curable composition containing the alkenyl phenol A can exhibit excellent miscibility.

The alkenyl group is not particularly limited, but examples include alkenyl groups having from 2 to 30 carbon atoms, such as a vinyl group, an allyl group, a propenyl group, a butenyl group, and a hexenyl group. Among them, from the viewpoints of more effectively and reliably achieving the effects of the present invention, the alkenyl group is preferably an allyl group and/or a propenyl group and more preferably an allyl group. The number of alkenyl groups directly bonded to one phenolic aromatic ring is not particularly limited and is, for example, from 1 to 4. From the viewpoints of more effectively and reliably achieving the effects of the present invention, the number of alkenyl groups directly bonded to one phenolic aromatic ring is preferably from 1 to 2 and more preferably 1.

The phenolic aromatic ring refers to a ring in which one or more hydroxyl groups are directly bonded to an aromatic ring, and examples include a phenol ring or a naphthol ring. The number of the hydroxyl groups directly bonded to one phenolic aromatic ring is not particularly limited and is, for example, from 1 to 2 and preferably 1.

The phenolic aromatic ring may have a substituent besides an alkenyl group. Examples of such a substituent include linear alkyl groups having from 1 to 10 carbon atoms, branched alkyl groups having from 3 to 10 carbon atoms, cyclic alkyl groups having from 3 to 10 carbon atoms, linear alkoxy groups having from 1 to 10 carbon atoms, branched alkoxy groups having from 3 to 10 carbon atoms, cyclic alkoxy groups having from 3 to 10 carbon atoms, and a halogen atom. In the phenolic aromatic ring having a substituent besides an alkenyl group, the number of such substituents directly bonded to one phenolic aromatic ring is not particularly limited and is, for example, from 1 to 2. In addition, the bonding position of such substituents to the phenolic aromatic ring is not particularly limited.

The alkenyl phenol A may have one or a plurality of structures in which one or more alkenyl groups are directly bonded to the phenolic aromatic ring. From the viewpoints of more effectively and reliably achieving the effects of the present invention, the alkenyl phenol A preferably has one or two structures in which one or more alkenyl groups are directly bonded to the phenolic aromatic ring, and the alkenyl phenol A preferably has two such structures.

The alkenyl phenol A may be, for example, a compound represented by Formula (1A) below or Formula (1B) below:

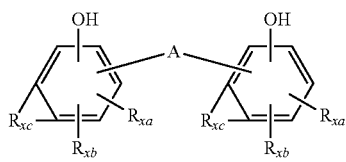 (1A)

where each Rxa independently represents an alkenyl group having from 2 to 8 carbon atoms; each Rxb independently represents an alkyl group having from 1 to 10 carbon atoms, or a hydrogen atom; each Rxc independently represents an aromatic ring having from 4 to 12 carbon atoms, where Rxc may form a fused structure with a benzene ring, and Rxc may be present or absent; A represents an alkylene group having from 1 to 6 carbon atoms, an aralkylene group having from 7 to 16 carbon atoms, an arylene group having from 6 to 10 carbon atoms, a fluorenylidene group, a sulfonyl group, an oxygen atom, a sulfur atom, or a direct bond (single bond); and when Rxc is absent, one benzene ring may have two or more groups of Rxa and/or Rxb; and

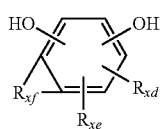 (1B)

where each Rxd independently represents an alkenyl group having from 2 to 8 carbon atoms; each Rxe independently represents an alkyl group having from 1 to 10 carbon atoms, or a hydrogen atom; each Rxf independently represents an aromatic ring having from 4 to 12 carbon atoms, where Rxf may form a fused structure with a benzene ring, and Rxf may be present or absent; and when Rxf is absent, one benzene ring may have two or more groups of Rxd and/or Rxe.

The alkenyl groups having from 2 to 8 carbon atoms represented as Rxa and Rxd in Formula (1A) and Formula (1B) are not particularly limited, but examples include a vinyl group, an allyl group, a propenyl group, a butenyl group, and hexenyl group.

When the groups represented by Rxc and Rxf in Formula (1A) and Formula (1B) form a fused structure with a benzene ring, examples of the phenolic aromatic ring include compounds containing a naphthol ring. In addition, when the groups represented by Rxc and Rxf in Formula (1A) and Formula (1B) are absent, examples of the phenolic aromatic ring include compounds containing a phenol ring.

The alkyl groups having from 1 to 10 carbon atoms represented as Rxb and Rxe in Formula (1A) and Formula (1B) are not particularly limited, but examples include linear alkyl groups, such as a methyl group, an ethyl group, a propyl group, a butyl group, a pentyl group, and a hexyl group; and branched alkyl groups, such as an isopropyl group, an isobutyl group, and a tert-butyl group.

The alkylene group having from 1 to 6 carbon atoms represented as A in Formula (1A) is not particularly limited, but examples include a methylene group, an ethylene group, a trimethylene group, and a propylene group. The aralkylene group having from 7 to 16 carbon atoms represented as A is not particularly limited, but examples include groups represented by formulas: —CH$_2$—Ar—CH$_2$—, —CH$_2$—CH$_2$—Ar—CH$_2$—CH$_2$—, or a formula: —CH$_2$—Ar—CH$_2$—CH$_2$—, where Ar represents a phenylene group, naphthylene group, or a biphenylene group. The arylene group having from 6 to 10 carbon atoms represented as A is not particularly limited, but examples include a phenylene ring.

From the viewpoints of more effectively and reliably achieving the effects of the present invention, in the compound represented by Formula (1B), Rxf is preferably a benzene ring (a compound containing a dihydroxynaphthalene backbone).

From the viewpoint of further improving miscibility, the alkenyl phenol A is preferably an alkenyl bisphenol in which one alkenyl group is bonded to each of two phenolic aromatic rings of a bisphenol. From a similar viewpoint, the alkenyl bisphenol is preferably a diallyl bisphenol in which one allyl group is bonded to each of two phenolic aromatic rings of the bisphenol, and/or a dipropenyl bisphenol in which one propenyl group is bonded to each of two phenolic aromatic rings of the bisphenol.

The diallyl bisphenol is not particularly limited, but examples include o,o'-diallyl bisphenol A ("DABPA", a product of Daiwa Kasei Industry Co., Ltd.), o,o'-diallyl bisphenol F, o,o'-diallyl bisphenol S, and o,o'-diallyl bisphenol fluorene. The dipropenyl bisphenol is not particularly limited, but examples include o,o'-dipropenyl bisphenol A ("PBA01" of Gunei Chemical Industry Co., Ltd.), o,o'-diallyl bisphenol F, o,o'-dipropenyl bisphenol S, and o,o'-dipropenyl bisphenol fluorene.

The average number of phenolic groups per molecule of the alkenyl phenol A is preferably 1 or larger and less than 3 and more preferably 1.5 or larger and 2.5 or less, from the viewpoints of more effectively and reliably achieving the effects of the present invention. The average number of phenolic groups is calculated by the following formula:

$$\text{Average number of phenolic groups} = \sum_{i=1}^{n}(Ai \times Xi)$$

where Ai represents the number of phenolic groups of an alkenyl phenol having i phenolic groups in the molecule, Xi represents the proportion of the alkenyl phenol having i phenolic groups in the molecule in all the alkenyl phenols, and $X_1+X_2+\ldots X_n=1$.

Epoxy-Modified Silicone B

The epoxy-modified silicone B is not particularly limited as long as it is a silicone compound or resin modified with an epoxy group-containing group. The curable composition containing the epoxy-modified silicone B can exhibit excellent low thermal expansion and chemical resistance.

The silicone compound or resin is not particularly limited as long as it is a compound having a polysiloxane backbone in which siloxane bonds are repeatedly formed. The polysiloxane backbone may be a linear backbone, a cyclic backbone, or a network backbone. Among these backbones, from the viewpoints of more effectively and reliably achieving the effects of the present invention, a linear backbone is preferred.

The epoxy group-containing group is not particularly limited, but examples include groups represented by Formula (a1) below:

—R⁰—X (a1)

where R⁰ represents an alkylene group (e.g., an alkylene group having from 1 to 5 carbon atoms, such as a methylene group, an ethylene group, and a propylene group), and x represents a monovalent group represented by Formula (a2) below or a monovalent group represented by Formula (a3) below:

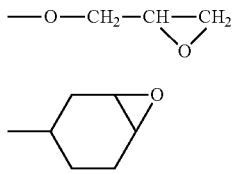
(a2)

(a3)

The epoxy-modified silicone B preferably contains an epoxy-modified silicone having from 140 to 250 g/mol of an epoxy group mol equivalent. The epoxy-modified silicone B containing an epoxy-modified silicone having an epoxy group mol equivalent within the above range tends to be able to further improve miscibility with a thermosetting resin, low thermal expansion, and chemical resistance in a balanced manner. From similar viewpoints, the epoxy group mol equivalent is more preferably from 145 to 245 g/mol and even more preferably from 150 to 240 g/mol.

The epoxy-modified silicone B preferably contains two or more epoxy-modified silicones from the viewpoints of further improving miscibility with a thermosetting resin, low thermal expansion, and chemical resistance in a balanced manner. In this case, the two or more epoxy-modified silicones preferably each have a different epoxy group mol equivalent, and the epoxy-modified silicone B more preferably contains an epoxy-modified silicone having an epoxy group mol equivalent from 50 to 350 g/mol and an epoxy-modified silicone having an epoxy group mol equivalent from 400 to 4000 g/mol, and even more preferably contains an epoxy-modified silicone having an epoxy group mol equivalent from 140 to 250 g/mol and an epoxy-modified silicone having an epoxy group mol equivalent from 450 to 3000 g/mol.

When the epoxy-modified silicone B contains two or more epoxy-modified silicones, the average epoxy group mol equivalent of the epoxy-modified silicone B is preferably from 140 to 3000 g/mol, more preferably from 250 to 2000 g/mol, and even more preferably from 300 to 1000 g/mol. The average epoxy group mol equivalent is calculated by the following formula:

$$\text{Average epoxy group mol equivalent} = \sum_{i=1}^{n} (Ei \times Wi)$$

where Ei represents the epoxy group mol equivalent of one epoxy-modified silicone of two or more epoxy-modified silicones, Wi represents the proportion of the epoxy-modified silicone in the epoxy-modified silicone B, and $W_1 + W_2 + \ldots W_n = 1$.

The epoxy-modified silicone B preferably contains an epoxy-modified silicone represented by Formula (1) below from the viewpoints of improved miscibility with a thermosetting resin, low thermal expansion, and chemical resistance in a balanced manner:

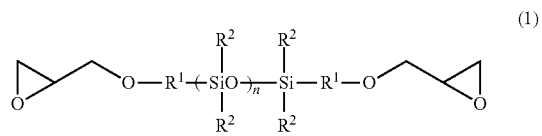
(1)

where each $R^1$ independently represents an alkylene group, a phenylene group, or an aralkylene group; each $R^2$ independently represents an alkyl group having from 1 to 10 carbon atoms, or a phenyl group; and n represents an integer of 1 or larger.

In Formula (1), each $R^1$ independently represents an alkylene group, a phenylene group, or an aralkylene group. The alkylene group represented by $R^1$ in Formula (1) may be a linear, branched, or cyclic alkylene group. The alkylene group has preferably from 1 to 12 and more preferably from 1 to 4 carbon atoms. The alkylene group is not particularly limited, but examples include a methylene group, an ethylene group, or a propylene group.

The aralkylene group represented by $R^1$ in Formula (1) has preferably from 7 to 30 and more preferably from 7 to 13 carbon atoms. The aralkylene group is not particularly limited, but examples include a group represented by Formula (X-I) below:

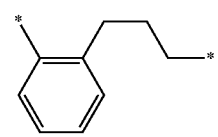
Formula (X-I)

where, in formula (X-I), * represents a bond.

The group represented by $R^1$ in Formula (1) may further have a substituent, and examples of the substituent include linear alkyl groups having from 1 to 10 carbon atoms, branched alkyl groups having from 3 to 10 carbon atoms, cyclic alkyl groups having from 3 to 10 carbon atoms, linear alkoxy groups having from 1 to 10 carbon atoms, branched alkoxy groups having from 3 to 10 carbon atoms, and cyclic alkoxy groups having from 3 to 10 carbon atoms. Among these groups, $R^1$ is particularly preferably a propylene group.

In Formula (1), each $R^2$ independently represents an alkyl group having from 1 to 10 carbon atoms, or a phenyl group. The alkyl group and the phenyl group may have a substituent. The alkyl group having from 1 to 10 carbon atoms may be a linear, branched, or cyclic alkyl group. The alkyl group is not particularly limited, but examples include a methyl group, an ethyl group, a propyl group, a butyl group, a pentyl group, a hexyl group, an isopropyl group, an isobutyl group, and a cyclohexyl group. Among these groups, $R^2$ is preferably a methyl group or a phenyl group.

In Formula (1), n represents an integer of 1 or larger and is, for example from 1 to 100. From the viewpoints of further improving miscibility with a thermosetting resin, low thermal expansion, and chemical resistance in a balanced manner, n is preferably 50 or less, more preferably 30 or less, and even more preferably 20 or less.

The epoxy-modified silicone B preferably contains two or more epoxy-modified silicones represented by Formula (1) from the viewpoints of further improving miscibility with a thermosetting resin, low thermal expansion, and chemical resistance in a balanced manner. In this case, the two or more epoxy-modified silicones contained in the epoxy-modified silicone B preferably each have a different n, and the epoxy-modified silicone B more preferably contains an epoxy-modified silicone having n of 1 to 2 in Formula (1) and an epoxy-modified silicone having n of 5 to 20 in Formula (1).

The average number of epoxy groups per molecule of the epoxy-modified silicone B is preferably 1 or larger and less than 3 and more preferably 1.5 or larger and 2.5 or less, from the viewpoints of more effectively and reliably achieving the effects of the present invention. The average number of epoxy groups is calculated by the following formula:

$$\text{Average number of epoxy groups} = \sum_{i=1}^{n}(Bi \times Yi)$$

where Bi represents the number of epoxy groups of an epoxy-modified silicone having i epoxy groups in the molecule, Yi represents the proportion of the epoxy-modified silicone having i epoxy groups in the molecule in all the epoxy-modified silicones, and $Y_1+Y_2+\ldots Y_n=1$.

Epoxy Compound C

The epoxy compound C is an epoxy compound other than the epoxy-modified silicone B and more specifically is an epoxy compound having no polysiloxane backbone. The curable composition containing the epoxy compound C can exhibit excellent miscibility, chemical resistance, adhesion to copper foil, and insulating reliability.

The epoxy compound C is not particularly limited as long as the compound is an epoxy compound other than the epoxy-modified silicone B. The epoxy compound preferably contains a bifunctional epoxy compound having two epoxy groups in a molecule from the viewpoints of even better miscibility, chemical resistance, adhesion to copper foil, and insulating reliability.

The bifunctional epoxy compound is not particularly limited, but examples include bisphenol-based epoxy resins (e.g., bisphenol A-based epoxy resins, bisphenol E-based epoxy resins, bisphenol F-based epoxy resins, bisphenol S-based epoxy resins, and bisphenol fluorene-based epoxy resins), phenolic novolac-based epoxy resins (e.g., phenol novolac-based epoxy resins, bisphenol A novolac-based epoxy resins, and cresol novolac-based epoxy resins), trisphenol methane-based epoxies, aralkyl-based epoxy resins, biphenyl-based epoxy resins containing a biphenyl backbone, naphthalene-based epoxy resins containing a naphthalene backbone, anthracene-based epoxy resins containing a dihydroanthracene backbone, glycidyl ester-based epoxy resins, polyol-based epoxy resins, isocyanurate ring-containing epoxy resins, dicyclopentadiene-based epoxy resins, fluorene-based epoxy resins containing a fluorene backbone, and epoxy resins constituted of a bisphenol A-based structural unit and a hydrocarbon-based structural unit; and their halogen compounds. One of these epoxy compounds is used alone, or two or more are used in combination.

The aralkyl-based epoxy resin is not particularly limited, but examples include compounds represented by Formula (b1) below:

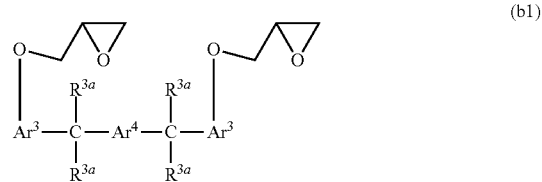

where each $Ar^3$ independently represents a benzene ring or a naphthalene ring; $Ar^4$ represents a benzene ring, a naphthalene ring, or a biphenyl ring; each $R^{3a}$ independently represents a hydrogen atom or a methyl group; and each ring may have a substituent besides a glycidyloxy group (e.g., an alkyl group having from 1 to 5 carbon atoms or a phenyl group).

The biphenyl-based epoxy resin is not particularly limited, but examples include compounds represented by Formula (b2) below (compounds b2):

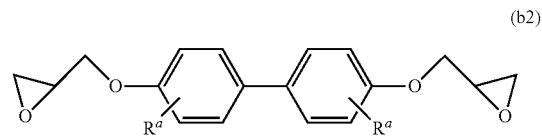

where each Ra independently represents an alkyl group having from 1 to 10 carbon atoms, or a hydrogen atom.

In Formula (b2), the alkyl group having from 1 to 10 carbon atoms may be linear, branched, or cyclic. The alkyl group is not particularly limited, but examples include a methyl group, an ethyl group, a propyl group, a butyl group, a pentyl group, a hexyl group, an isopropyl group, an isobutyl group, and a cyclohexyl group.

When the biphenyl-based epoxy resin is a compound b2, the biphenyl-based epoxy resin may be in the form of a mixture of compounds b2 having different numbers of Ra('s) that is/are an alkyl group(s). Specifically, the biphenyl-based epoxy resin is preferably a mixture of biphenyl epoxy resins having different numbers of Ra('s) that is/are an alkyl group(s), and more preferably a mixture of a compound b2 having no alkyl group Ra and a compound b2 having four alkyl group Ra's.

The naphthalene-based epoxy resin is not particularly limited, but examples include compounds represented by Formula (b3) below:

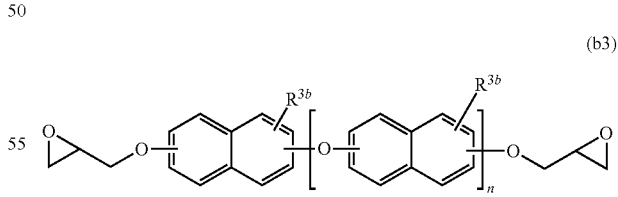

where each $R^{3b}$ independently represents a hydrogen atom, an alkyl group having from 1 to 5 carbon atoms (e.g., a methyl group or an ethyl group), an aralkyl group, a benzyl group, a naphthyl group, or a glycidyloxy group-containing naphthyl; and n represents an integer of 0 or larger (e.g., 0 to 2).

The dicyclopentadiene-based epoxy resin is not particularly limited, but examples include compounds represented by Formula (b4) below:

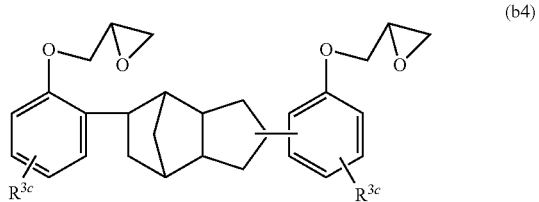

(b4)

where each $R^{3c}$ independently represents a hydrogen atom or an alkyl group having from 1 to 5 carbon atoms (e.g., a methyl group or an ethyl group).

The epoxy resin constituted of a bisphenol A-based structural unit and a hydrocarbon-based structural unit is not particularly limited, but examples include compounds represented by Formula (b5) below:

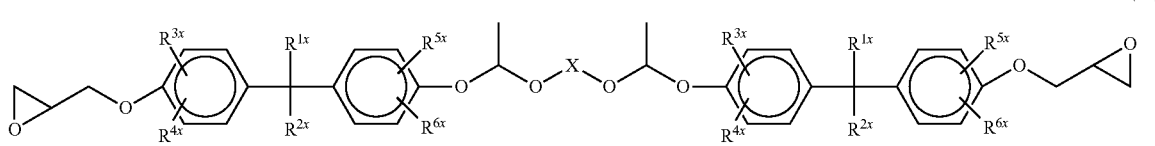

(b5)

where each of $R^{1x}$ and $R^{2x}$ independently represents a hydrogen atom or a methyl group; each of $R^{3x}$ to $R^{6x}$ independently represents a hydrogen atom, a methyl group, a chlorine atom, or a bromine atom; and x represents an ethyleneoxyethyl group, a di(ethyleneoxy)ethyl group, a tri(ethyleneoxy)ethyl group, a propyleneoxypropyl group, a di(propyleneoxy)propyl group, a tri(propyleneoxy)propyl group, or an alkylene group having from 2 to 15 carbon atoms (e.g., a methylene group or an ethylene groups).

Among these resins, from the viewpoints of even better miscibility, chemical resistance, adhesion to copper foil, and insulating reliability, the epoxy compound C is preferably one or more selected from the group consisting of bisphenol-based epoxy resins, aralkyl-based epoxy resins, biphenyl-based epoxy resins, naphthalene-based epoxy resins, and dicyclopentadiene-based epoxy resins, and more preferably a biphenyl-based epoxy resin and/or a naphthalene-based epoxy resin.

The average number of epoxy groups per molecule of the epoxy compound is preferably 1 or larger and less than 3 and more preferably 1.5 or larger and 2.5 or less, from the viewpoints of more effectively and reliably achieving the effects of the present invention. The average number of epoxy groups is calculated by the following formula:

$$\text{Average number of epoxy groups} = \sum_{i=1}^{n}(Ci \times Zi)$$

where Ci represents the number of epoxy groups of an epoxy compound having i epoxy groups in the molecule, Zi represents the proportion of the epoxy compound having epoxy groups in the molecule in all the epoxy compounds, and $Z_1 + Z_2 + \ldots Z_n = 1$.

The content of the epoxy compound C is preferably from 5 to 95 mass %, more preferably from 5 to 90 mass %, even more preferably from 5 to 50 mass %, and particularly preferably from 20 to 50 mass % based on a total amount of 100 mass % of the epoxy-modified silicone B and the epoxy compound C from the viewpoints of even better miscibility, chemical resistance, adhesion to copper foil, and insulating reliability.

Phenolic Compound F Other Than Alkenyl Phenol A

The curable composition of the first embodiment preferably contains a phenolic compound F besides the alkenyl phenol A from the viewpoint of even better adhesion to copper foil. The phenolic compound F is not particularly limited, but examples include bisphenol-based phenolic resins (e.g., such as bisphenol A-based resins, bisphenol E-based resins, bisphenol F-based resins, and bisphenol S-based resins,), phenolic novolac resins (e.g., such as phenol novolac resins, naphthol novolac resins, and cresol novolac resins), glycidyl ester-based phenolic resins, naphthalene-based phenolic resins, anthracene-based phenolic resins, dicyclopentadiene-based phenolic resins, biphenyl-based phenolic resins, alicyclic-based phenolic resins, polyol-based phenolic resins, aralkyl-based phenolic resins, phenol-modified aromatic hydrocarbon formaldehyde resins, and fluorene-based phenolic resins. One of these phenolic compounds is used alone, or two or more are used in combination.

Among these phenolic compounds, the phenolic compound F is preferably a bifunctional phenolic compound having two phenolic hydroxyl groups in a molecule from the viewpoints of even better miscibility and adhesion to copper foil.

The bifunctional phenolic compound is not particularly limited, but examples include bisphenols, biscresols, and bisphenols having a fluorene backbone (e.g., such as bisphenols having a fluorene backbone and biscresols having a fluorene backbone), biphenols (e.g., such as p,p'-biphenol), dihydroxydiphenyl ethers (e.g., such as 4,4'-dihydroxydiphenyl ether), dihydroxydiphenyl ketones (e.g., such as 4,4'-dihydroxydiphenyl ketone), dihydroxydiphenyl sulfides (e.g., such as 4,4'-dihydroxydiphenyl sulfide), and dihydroxyarenes (e.g., such as hydroquinone). One of these bifunctional phenolic compounds is used alone, or two or more are used in combination. Among these bifunctional phenolic compounds, the bifunctional phenolic compound is preferably a bisphenol, a biscresol, and a bisphenol having a fluorene backbone from the viewpoint of even better adhesion to copper foil.

The content of the alkenyl phenol A is preferably from 1 to 50 parts by mass, more preferably from 10 to 45 parts by mass, and even more preferably from 15 to 40 parts by mass based on a total amount of 100 parts by mass of the alkenyl phenol A, the epoxy-modified silicone B, the epoxy compound C, and the phenolic compound F from the viewpoint of even better miscibility.

The content of the epoxy-modified silicone B is preferably from 5 to 70 parts by mass, more preferably from 10 to 60 parts by mass, and even more preferably from 40 to 50 parts by mass based on a total amount of 100 parts by mass of the alkenyl phenol A, the epoxy-modified silicone B, the epoxy compound C, and the phenolic compound F from the viewpoints of realizing even better low thermal expansion and chemical resistance in a balanced manner.

The content of the epoxy compound C is preferably from 1 to 50 parts by mass, more preferably from 5 to 40 parts by mass, and even more preferably from 10 to 30 parts by mass based on a total amount of 100 parts by mass of the alkenyl phenol A, the epoxy-modified silicone B, the epoxy compound C, and the phenolic compound F from the viewpoints of even better miscibility, chemical resistance, adhesion to copper foil, and insulating reliability.

The content of the phenolic compound F is preferably from 1 to 50 parts by mass, more preferably from 5 to 40 parts by mass, and even more preferably from 10 to 30 parts by mass based on a total amount of 100 parts by mass of the alkenyl phenol A, the epoxy-modified silicone B, the epoxy compound C, and the phenolic compound F from the viewpoint of even better adhesion to copper foil.

In a case where the curable composition contains no phenolic compound F, the content of each of the alkenyl phenol A, the epoxy-modified silicone B, and the epoxy compound C described above represents the content based on a total amount of 100 parts by mass of the alkenyl phenol A, the epoxy-modified silicone B, and the epoxy compound C.

Second Embodiment

Curable Composition

A curable composition of a second embodiment contains a polymer D containing a constituent unit derived from the alkenyl phenol A, a constituent unit derived from the epoxy-modified silicone B, and a constituent unit derived from the epoxy compound C. The alkenyl phenol A, the epoxy-modified silicone B, and the epoxy compound C described in the first embodiment can be used.

The polymer D can exhibit sufficient miscibility even when mixed with a thermosetting resin having poor miscibility with silicone-based compounds. This enables the curable composition containing the polymer D and a thermosetting resin to provide a homogeneous varnish or cured product. The cured product, such as a prepreg, obtained using the curable composition is a product in which the components are homogeneously mixed, and variation in physical properties due to non-homogeneity of the components is suppressed.

In addition to the polymer D, the curable composition of the second embodiment may contain one or more selected from the group consisting of the alkenyl phenol A, the epoxy-modified silicone B, and the epoxy compound C. In this case, the alkenyl phenol A, the epoxy-modified silicone B, or the epoxy compound C contained in the curable composition of the second embodiment may be an unreacted component which remains after polymerization of the polymer D or may be a component newly added to a purified polymer D.

Polymer D

The polymer D contains a constituent unit derived from the alkenyl phenol A, a constituent unit derived from the epoxy-modified silicone B, and a constituent unit derived from the epoxy compound C and may further contain as necessary a constituent unit derived from the phenolic compound F. Hereinafter, each constituent unit is also referred to as the constituent unit A, B, C, or F. Using the polymer D enables the curable composition of the second embodiment to exhibit even better miscibility, thermal expansion, chemical resistance, peel strength, and insulating reliability.

The weight average molecular weight of the polymer D is preferably from $3.0 \times 10^3$ to $5.0 \times 10^4$ and more preferably from $3.0 \times 10^3$ to $2.0 \times 10^4$ by gel permeation chromatography based on calibration with polystyrene. With the weight average molecular weight of the polymer D of $3.0 \times 10^3$ or larger, the curable composition tends to be able to exhibit even better adhesion to copper foil and chemical resistance. With the weight average molecular weight of the polymer D of $5.0 \times 10^4$ or smaller, the curable composition tends to be able to exhibit even better miscibility.

The content of the constituent unit A in the polymer D is preferably from 5 to 50 mass % based on a total mass of the polymer D. With the content of the constituent unit A within the above range, the curable composition tends to be able to exhibit even better miscibility. From a similar viewpoint, the content of the constituent unit A is more preferably from 10 to 45 mass % and even more preferably from 15 to 40 mass %.

The content of the constituent unit B in the polymer D is preferably from 20 to 60 mass % based on a total mass of the polymer D. With the content of the constituent unit B within the above range, the curable composition tends to be able to exhibit even better low thermal expansion and chemical resistance in a balanced manner. From similar viewpoints, the content of the constituent unit B is more preferably from 25 to 55 mass % and even more preferably from 30 to 50 mass %.

The constituent unit B is preferably a constituent unit derived from an epoxy-modified silicone having an epoxy group mol equivalent from 50 to 350 g/mol (hereinafter also referred to as "the lower mol equivalent epoxy-modified silicone B1") and an epoxy-modified silicone having an epoxy group mol equivalent from 400 to 4000 g/mol (hereinafter also referred to as "the higher mol equivalent epoxy-modified silicone B2").

The content of the constituent unit B1 derived from the lower mol equivalent epoxy-modified silicone B1 in the polymer D is preferably from 5 to 22.5 mass %, more preferably from 10 to 20 mass %, and even more preferably from 10 to 17 mass % based on a total mass of the polymer D.

The content of the constituent unit B2 derived from the higher mol equivalent epoxy-modified silicone B2 in the polymer D is preferably from 15 to 55 mass %, more preferably from 20 to 52.5 mass %, and even more preferably from 25 to 50 mass % based on a total mass of the polymer D.

The mass ratio of the content of the constituent unit B2 to the content of the constituent unit B1 is preferably from 1.5 to 4, more preferably from 1.7 to 3.5, and even more preferably from 1.9 to 3.1. The contents of the constituent unit B1 and the constituent unit B2 having the above relationship tend to further improve adhesion to copper foil and chemical resistance.

The content of the constituent unit C in the polymer D is preferably from 5 to 30 mass % based on a total mass of the polymer D. With the content of the constituent unit C within the above range, the curable composition tends to be able to exhibit even better miscibility, chemical resistance, adhesion to copper foil, and insulating reliability. From similar viewpoints, the content of the constituent unit C is more preferably from 10 to 25 mass % and even more preferably from 15 to 20 mass %.

In addition, the content of the constituent unit C is preferably from 5 to 95 mass %, more preferably from 5 to 90 mass %, even more preferably from 5 to 50 mass %, and particularly preferably from 20 to 50 mass % based on a total mass of the constituent unit B and the constituent unit C. The contents of the constituent unit B and the constituent unit C having the above relationship tend to further improve even better miscibility, chemical resistance, adhesion to copper foil, and insulating reliability.

The content of the constituent unit F in the polymer D is preferably from 5 to 30 mass % based on a total mass of the polymer D. With the content of the constituent unit F within the above range, the curable composition tends to be able to exhibit even better adhesion to copper foil. From a similar viewpoint, the content of the constituent unit F is more preferably from 10 to 25 mass % and even more preferably from 15 to 20 mass %.

The alkenyl group mol equivalent of the polymer D is preferably from 300 to 1500 g/mol. With the alkenyl group mol equivalent of 300 g/mol or larger, the elastic modulus of a cured product of the curable composition tends to further decrease, and as a result, this tends to be able to further reduce the thermal expansion of a base material or the like produced using the cured product. The alkenyl group mol equivalent of 1500 g/mol or less tends to further improve the miscibility, chemical resistance, and reliability of the curable composition. From similar viewpoints, the alkenyl group mol equivalent is preferably from 350 to 1200 g/mol and more preferably from 400 to 1000 g/mol.

The polymer D is obtained, for example, by a process of reacting the alkenyl phenol A, the epoxy-modified silicone B, the epoxy compound C, and, as necessary, the phenolic compound F in the presence of a polymerization catalyst G. The reaction may be performed in the presence of an organic solvent. More specifically, the polymer D can be obtained by an addition reaction of epoxy groups contained in the epoxy-modified silicone B and the epoxy compound C and a hydroxyl group contained in the alkenyl phenol A, an addition reaction of a hydroxyl group contained in the resulting product of the addition reaction and epoxy groups contained in the epoxy-modified silicone B and the epoxy compound C, and the like preformed in the process described above.

The polymerization catalyst G is not particularly limited, and examples include imidazole catalysts and phosphorus-based catalysts. One of these catalysts is used alone, or two or more are used in combination. Among these catalysts, imidazole catalysts are preferred.

The imidazole catalyst is not particularly limited, and examples include, imidazoles such as 2-methylimidazole, 2-ethyl-4-methylimidazole, 2-phenylimidazole, 1-cyanoethyl-2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,3-dihydro-1H-pyrrolo[1,2-a]benzimidazole ("TBZ", a product of Shikoku Chemicals Corporation), and 2,4,5-triphenylimidazole ("TPIZ", a product of Tokyo Chemical Industry Co., Ltd.). Among these catalysts, from the viewpoint of preventing homopolymerization of the epoxy component, 2,3-dihydro-1H-pyrrolo[1,2-a]benzimidazole and/or 2,4,5-triphenylimidazole ("TPIZ", a product of Tokyo Chemical Industry Co., Ltd.) are preferred.

The amount of the polymerization catalyst G (preferably an imidazole catalyst) used is not particularly limited and is, for example, from 0.1 to 10 parts by mass based on a total amount of 100 parts by mass of the alkenyl phenol A, the epoxy-modified silicone B, the epoxy compound C, and the phenolic compound F. From the viewpoint of increasing the weight average molecular weight of the polymer D, the amount of the polymerization catalyst G used is preferably 1.0 parts by mass or larger and more preferably 4.0 parts by mass or larger.

The organic solvent is not particularly limited, and for example, a polar solvent or a non-polar solvent can be used. The polar solvent is not particularly limited, but examples include ketones, such as, acetone, methyl ethyl ketone, and methyl isobutyl ketone; Cellosolve-based solvents, such as propylene glycol monomethyl ether and propylene glycol monomethyl ether acetate; ester-based solvents, such as ethyl lactate, methyl acetate, ethyl acetate, butyl acetate, isoamyl acetate, ethyl lactate, methyl methoxypropionate, and methyl hydroxyisobutyrate; and amides, such as dimethylacetamide and dimethylformamide. The non-polar solvent is not particularly limited, but examples include aromatic hydrocarbons, such as toluene and xylene. One of these solvents is used alone, or two or more are used in combination.

The amount of the organic solvent used is not particularly limited and is, for example, from 50 to 150 parts by mass based on a total amount of 100 parts by mass of the alkenyl phenol A, the epoxy-modified silicone B, the epoxy compound C, and the phenolic compound F.

The heating temperature is not particularly limited and may be, for example, from 100 to 170° C. The heating time is also not particularly limited and may be, for example, from 3 to 8 hours.

After completion of the reaction in this process, the polymer D may be separated and purified from the reaction mixture by a method commonly used in the art.

Thermosetting Resin E

The curable compositions of the first and second embodiments preferably contain a thermosetting resin E. The polymer D, which has a silicone-based backbone, exhibits excellent miscibility even with a thermosetting resin having poor miscibility with silicone-based compounds. Thus, even when the polymer D and the thermosetting resin E are combined, the components do not separate in the curable composition, exhibiting excellent miscibility. In addition, the curable composition of the second embodiment containing the polymer D and the thermosetting resin E can exhibit even better low thermal expansion and chemical resistance.

From the viewpoints of further improving low thermal expansion, chemical resistance, and adhesion to copper foil, the thermosetting resin E preferably contains one or more selected from the group consisting of a maleimide compound, a cyanate ester compound, a phenolic compound, an alkenyl-substituted nadimide compound, and an epoxy compound, and more preferably contains one or more selected from the group consisting of a maleimide compound, a cyanate ester compound, a phenolic compound, and an epoxy compound.

The content of the thermosetting resin E is preferably from 10 to 90 mass %, more preferably from 20 to 80 mass %, and even more preferably from 30 to 75 mass % based on 100 mass % of resin solids.

Maleimide Compound

The thermosetting resin E preferably contains a maleimide compound from the viewpoints of further improving low thermal expansion and chemical resistance. The maleimide compound is not particularly limited as long as the compound has one or more maleimide groups in a molecule, but examples include monomaleimide compounds having one maleimide group in a molecule (e.g., such as N-phenylmaleimide and N-hydroxyphenylmaleimide), polymaleimide compounds having two or more maleimide groups in a molecule (e.g., such as bis(4-maleimidophenyl)methane, 2,2-bis{4-(4-maleimidophenoxy)-phenyl}propane, bis(3-ethyl-5-methyl-4-maleimidophenyl)methane, bis(3,5-dimethyl-4-maleimidophenyl)methane, bis(3,5-diethyl-4-maleimidophenyl)methane), m-phenylene bismaleimide, 4-methyl-1,3-phenylene bismaleimide, 1,6'-bismaleimido-(2,2,4-trimethyl)hexane, maleimide compounds represented by Formula (3) below, and prepolymers of these maleimide compounds and an amine compound.

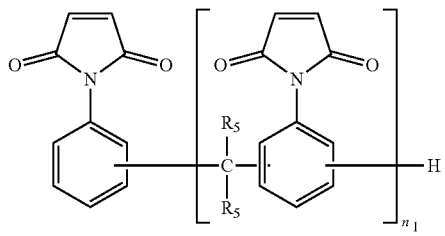

(3)

where each $R_5$ independently represents a hydrogen atom or a methyl group; and $n_1$ represents an integer of 1 or larger.

$n_1$ is 1 or larger, preferably from 1 to 100, and more preferably from 1 to 10.

One of these maleimide compounds is used alone, or two or more are used in combination. Among these maleimide compounds, from the viewpoints of further improving low thermal expansion and chemical resistance, the maleimide compound preferably contains at least one selected from the group consisting of bis(4-maleimidophenyl)methane, 2,2-bis{4-(4-maleimidophenoxy)-phenyl}propane, bis(3-ethyl-5-methyl-4-maleimidophenyl)methane, and maleimide compounds represented by Formula (3).

A maleimide compound commercially available or prepared by a known method may be used. Examples of the commercially available maleimide compound include "BMI-70", "BMI-80", and "BMI-1000P", which are products of K-I Chemical Industry Co., Ltd.; "BMI-3000", "BMI-4000", "BMI-5100", "BMI-7000", and "BMI-2300", which are products of Daiwa Kasei Industry Co., Ltd.; and "MIR-3000", which is a product of Nippon Kayaku Co., Ltd.

From the viewpoints of further improving low thermal expansion and chemical resistance, the content of the maleimide compound is preferably from 1 to 50 parts by mass, more preferably from 5 to 40 parts by mass, and even more preferably from 10 to 40 parts by mass based on 100 parts by mass of resin solids.

Cyanate Ester Compound

The thermosetting resin E preferably contains a cyanate ester compound from the viewpoints of further improving low thermal expansion and chemical resistance. The cyanate ester compound is not particularly limited as long as the compound has two or more cyanato groups (cyanate ester groups) in a molecule, but examples include compounds represented by Formula (4) below, compounds represented by Formula (5) below excluding the compounds represented by Formula (4), biphenyl aralkyl-based cyanate esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2-bis(4-cyanatophenyl)propane. One of these cyanate ester compounds is used alone, or two or more are used in combination.

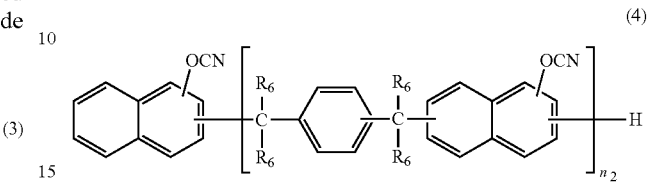

(4)

where each $R_6$ independently represents a hydrogen atom or a methyl group; and $n_2$ represents an integer of 1 or larger.

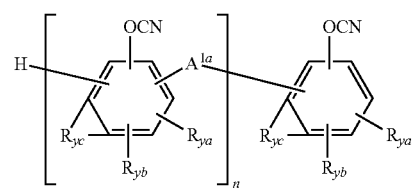

(5)

where each Rya independently represents an alkenyl group having from 2 to 8 carbon atoms; each Ryb independently represents an alkyl group having from 1 to 10 carbon atoms, or a hydrogen atom; and each Ryc independently represents an aromatic ring having from 4 to 12 carbon atoms, where Ryc may form a fused structure with a benzene ring, and Ryc may be present or absent; $A^{1a}$ represents an alkylene group having from 1 to 6 carbon atoms, an aralkylene group having from 7 to 16 carbon atoms, an arylene group having from 6 to 10 carbon atoms, a fluorenylidene group, a sulfonyl group, an oxygen atom, a sulfur atom, or a direct bond (single bond); when Ryc is absent, one benzene ring may have two or more groups of Rya and/or Ryb; and n represents an integer from 1 to 10.

Among these compounds, from the viewpoints of further improving low thermal expansion and chemical resistance, the cyanate ester compound preferably contains a compound represented by Formula (4) and/or Formula (5).

In Formula (4), $n_2$ represents an integer of 1 or larger, and is preferably an integer from 1 to 20 and more preferably an integer from 1 to 10.

The alkenyl group having from 2 to 8 carbon atoms represented as Rya in Formula (5) is not particularly limited, but examples include a vinyl group, an allyl group, a propenyl group, a butenyl group, and a hexenyl group.

The alkyl group having from 1 to 10 carbon atoms represented as Ryb in Formula (5) is not particularly limited, but examples include linear alkyl groups, such as a methyl group, an ethyl group, a propyl group, a butyl group, a pentyl group, and a hexyl group; and branched alkyl groups, such as an isopropyl group, an isobutyl group, and a tert-butyl group.

The alkylene group having from 1 to 6 carbon atoms represented as $A^{1a}$ in Formula (5) is not particularly limited, but examples include a methyl group, an ethylene group, a trimethylene group, and a propylene group. In addition, the aralkylene group having from 7 to 16 carbon atoms represented as $A^{1a}$ in Formula (5) is not particularly limited, but examples include groups represented by formulas: —CH$_2$—Ar—CH$_2$—, —CH$_2$—CH$_2$—Ar—CH$_2$—CH$_2$—, or a formula: —CH$_2$—Ar—CH$_2$—CH$_2$—, where Ar represents a phenylene group, naphthylene group, or a biphenylene group. Furthermore, the arylene group having from 6 to 10 carbon atoms represented as $A^{1a}$ is not particularly limited, but examples include a phenylene ring.

In Formula (5), n represents an integer of 1 to 10, and is preferably an integer from 1 to 20 and more preferably an integer from 1 to 10.

The compound represented by Formula (5) is preferably a compound represented by Formula (c1) below:

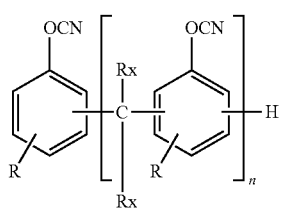

where each Rx independently represents a hydrogen atom or a methyl group; each R independently represents an alkenyl group having from 2 to 8 carbon atoms, an alkyl group having from 1 to 10 carbon atoms, or a hydrogen atom; and n represents an integer from 1 to 10.

These cyanate ester compounds may be produced according to a known method. Examples of a specific production method include methods described in JP 2017-195334 A (in particular, paragraphs 0052 to 0057) and the like.

From the viewpoints of further improving low thermal expansion and chemical resistance, the content of the cyanate ester compound as the thermosetting resin E is preferably from 10 to 70 parts by mass, more preferably from 15 to 60 parts by mass, and even more preferably from 20 to 50 parts by mass based on 100 parts by mass of resin solids.

Phenolic Compound

The thermosetting resin E preferably contains a phenolic compound from the viewpoint of further improving adhesion to copper foil. The phenolic compound is not particularly limited as long as the compound has two or more phenolic hydroxyl groups in a molecule, but examples include phenols having two or more phenolic hydroxyl groups in a molecule, bisphenols (e.g., such as bisphenol A, bisphenol E, bisphenol F, and bisphenol S), diallyl bisphenols (e.g., such as diallyl bisphenol A, diallyl bisphenol E, diallyl bisphenol F, and diallyl bisphenol S), phenolic novolac resins (e.g., such as phenol novolac resins, naphthol novolac resins, and cresol novolac resins), naphthalene-based phenolic resins, dihydroanthracene-based phenolic resins, dicyclopentadiene-based phenolic resins, biphenyl-based phenolic resins, and aralkyl-based phenolic resins. One of these phenolic compounds is used alone, or two or more are used in combination. Among these compounds, from the viewpoint of further improving adhesion to copper foil, the phenolic compound preferably contains an aralkyl-based phenolic resin.

Aralkyl-Based Phenolic Resin

Examples of the aralkyl-based phenolic resin include compounds represented by Formula (c2) below:

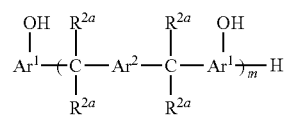

where each $Ar^1$ independently represents a benzene ring or a naphthalene ring; $Ar^2$ represents a benzene ring, a naphthalene ring, or a biphenyl ring; each $R^{2a}$ independently represents a hydrogen atom or a methyl group; m represents an integer from 1 to 50; and each ring may have a substituent besides a hydroxyl group (e.g., such as an alkyl group having from 1 to 5 carbon atoms or a phenyl group).

From the viewpoint of further improving adhesion to copper foil, the compound represented by Formula (c2) is preferably a compound in which $Ar^1$ is a naphthalene ring and $Ar^2$ is a benzene ring in Formula (c2) (hereinafter also referred to as a "naphthol aralkyl-based phenolic resin") and a compound in which $Ar^1$ is a benzene ring and $Ar^2$ is a biphenyl ring in Formula (c2) (hereinafter also referred to as a "biphenyl aralkyl-based phenolic resin").

The naphthol aralkyl-based phenolic resin is preferably a compound represented by Formula (2b) below:

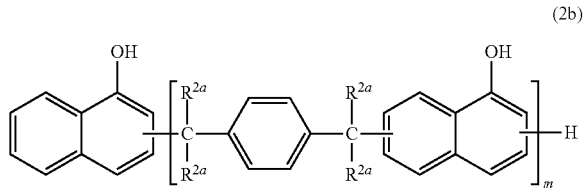

where each $R^{2a}$ independently represents a hydrogen atom or a methyl group (preferably a hydrogen atom); and m represents an integer from 1 to 10 (preferably an integer from 1 to 6).

The biphenyl aralkyl-based phenolic resin is preferably a compound represented by Formula (2c) below:

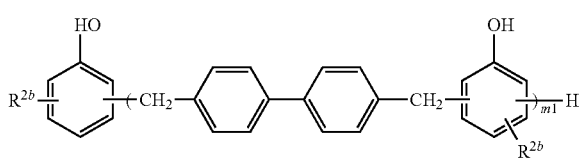

where each $R^{2b}$ independently represents a hydrogen atom, an alkyl group having from 1 to 5 carbon atoms, or a phenyl group (preferably a hydrogen atom); and m1 represents an integer from 1 to 20 (preferably an integer from 1 to 6).

An aralkyl-based phenolic resin commercially available or synthesized by a known method may be used. Examples of the commercially available aralkyl-based phenolic resin include "KAYAHARD GPH-65", "KAYAHARD GPH-78", and "KAYAHARD GPH-103" (biphenyl aralkyl-based phenolic resins), which are products of Nippon Kayaku Co., Ltd.; and "SN-495" (a naphthol aralkyl-based phenolic resin), which is a product of Nippon Steel Chemical Co., Ltd.

From the viewpoint of further improving adhesion to copper foil, the content of the phenolic compound as the thermosetting resin E is preferably from 10 to 40 parts by mass, more preferably from 15 to 35 parts by mass, and even more preferably from 20 to 30 parts by mass based on 100 parts by mass of resin solids.

Alkenyl-Substituted Nadimide Compound

The thermosetting resin E preferably contains an alkenyl-substituted nadimide compound from the viewpoint of further improving heat resistance. The alkenyl-substituted nadimide compound is not particularly limited as long as the compound has one or more alkenyl-substituted nadimide groups in a molecule, but examples include compounds represented by Formula (2d) below:

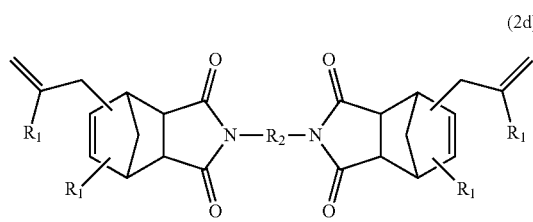

(2d)

where each $R_1$ independently represents a hydrogen atom or an alkyl group having from 1 to 6 carbon atoms (e.g., a methyl group or an ethyl group); and $R_2$ represents an alkylene group having from 1 to 6 carbon atoms, a phenylene group, a biphenylene group, a naphthylene group, or a group represented by Formula (6) below or Formula (7) below:

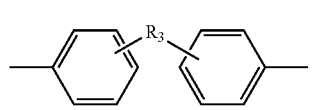

(6)

where, in Formula (6), $R_3$ represents a methylene group, an isopropylidene group, CO, O, S, or $SO_2$; and

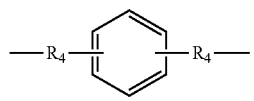

(7)

where, in Formula (7), each $R_4$ independently represents an alkylene group having from 1 to 4 carbon atoms or a cycloalkylene group having from 5 to 8 carbon atoms.

An alkenyl-substituted nadimide compound represented by Formula (6) or Formula (7) that is commercially available or produced according to a known method may be used. Examples of the commercially available products include "BANI-M" and "BANI-X", which are products of Maruzen Petrochemical Co., Ltd.

The content of the alkenyl-substituted nadimide compound as the thermosetting resin E is preferably from 1 to 40 parts by mass, more preferably from 5 to 35 parts by mass, and even more preferably from 10 to 30 parts by mass based on 100 parts by mass of resin solids.

Epoxy Compound

The thermosetting resin E preferably contains an epoxy compound from the viewpoints of further improving chemical resistance, adhesion to copper foil, and insulating reliability. This epoxy compound refers to an epoxy compound different from the epoxy-modified silicone B and the epoxy compound C constituting the polymer D.

The epoxy compound is not particularly limited as long as the compound has two or more epoxy groups in a molecule, and examples include bisphenol-based epoxy resins (e.g., bisphenol A-based epoxy resins, bisphenol E-based epoxy resins, bisphenol F-based epoxy resins, and bisphenol S-based epoxy resins), diallyl bisphenol-based epoxy resins (e.g., such as diallyl bisphenol A-based epoxy resins, diallyl bisphenol E-based epoxy resins, diallyl bisphenol F-based epoxy resins, and diallyl bisphenol S-based epoxy resins), phenolic novolac-based epoxy resins (e.g., phenol novolac-based epoxy resins, bisphenol A novolac-based epoxy resins, and cresol novolac-based epoxy resins), aralkyl-based epoxy resins, biphenyl-based epoxy resins containing a biphenyl backbone, naphthalene-based epoxy resins containing a naphthalene backbone, anthracene-based epoxy resins containing a dihydroanthracene backbone, glycidyl esters, polyol-based epoxy resins, isocyanurate ring-containing epoxy resins, dicyclopentadiene-based epoxy resins, epoxy resins constituted of a bisphenol A-based structural unit and a hydrocarbon-based structural unit, and their halogen compounds. One of these epoxy compounds is used alone, or two or more are used in combination.

Among these epoxy compounds, from the viewpoints of further improving chemical resistance, adhesion to copper foil, and insulating reliability, the epoxy compound is preferably one or more selected from the group consisting of aralkyl-based epoxy resins, naphthalene-based epoxy resins, dicyclopentadiene-based epoxy resins, and epoxy resins constituted of a bisphenol A-based structural unit and a hydrocarbon-based structural unit, and more preferably contains a naphthalene-based epoxy resin.

Aralkyl-Based Epoxy Resin

The aralkyl-based epoxy resin is not particularly limited, but examples include compounds represented by Formula (3a) below:

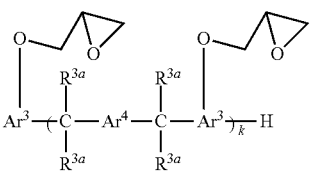

(3a)

where each $Ar^3$ independently represents a benzene ring or a naphthalene ring; $Ar^4$ represents a benzene ring, a naphthalene ring, or a biphenyl ring; each $R^{3a}$ independently represents a hydrogen atom or a methyl group; k represents an integer from 1 to 50; and each ring may have a substituent besides a glycidyloxy group (e.g., an alkyl group having from 1 to 5 carbon atoms or a phenyl group).

The compound represented by Formula (3a) is preferably a compound in which $Ar^3$ is a naphthalene ring and $Ar^4$ is a benzene ring (also referred to as a "naphthalene aralkyl-based epoxy resin") and a compound in which $Ar^3$ is a benzene ring and $Ar^4$ is a biphenyl ring (also referred to as a "biphenyl aralkyl-based epoxy resin"), and more preferably a biphenyl aralkyl-based epoxy resin.

The biphenyl aralkyl-based epoxy resin is preferably a compound represented by Formula (3b) below:

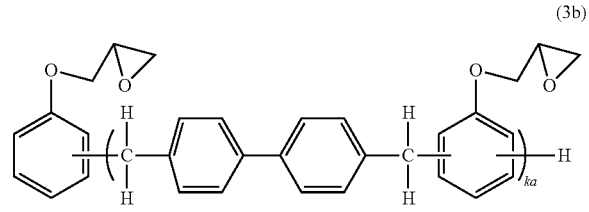

(3b)

where ka represents an integer of 1 or larger, preferably from 1 to 20, and more preferably from 1 to 6.

In addition, the aralkyl-based epoxy resin may be a compound represented by Formula (3c) below:

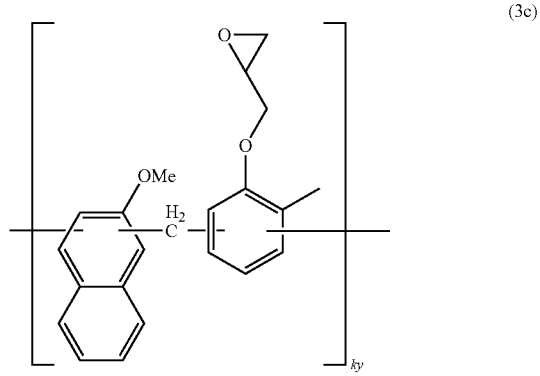

(3c)

where ky represents an integer from 1 to 10.

An aralkyl-based epoxy resin commercially available or prepared by a known method may be used. Examples of the commercially available naphthalene aralkyl-based epoxy resin include "Epotote (trade name) ESN-155", "Epotote (trade name) ESN-355", "Epotote (trade name) ESN-375", "Epotote (trade name) ESN-475V", "Epotote (trade name) ESN-485", and "Epotote (trade name) ESN-175", which are products of Nippon Steel & Sumikin Materials Co., Ltd.; "NC-7000", "NC-7300", and "NC-7300L", which are products of Nippon Kayaku Co., Ltd.; and "HP-5000" and "HP-9900", which are products of DIC Corporation. Examples of the commercially available biphenyl aralkyl-based epoxy resin include "NC-3000", "NC-3000L", and "NC-3000FH", which are products of Nippon Kayaku Co., Ltd.

Naphthalene-Based Epoxy Resin

The naphthalene-based epoxy resin is not particularly limited, but examples include epoxy resins excluding the naphthalene aralkyl-based epoxy resin described above, such as naphthalene backbone-containing polyfunctional epoxy resins having a naphthalene backbone represented by Formula (3-1) below, and epoxy resins having a naphthalene backbone. Specific examples of the naphthalene-based epoxy resin include naphthylene ether-based epoxy resins, and from the viewpoints of further improving chemical resistance, adhesion to copper foil, and insulating reliability, the naphthalene epoxy resin is preferably a naphthylene ether-based epoxy resin.

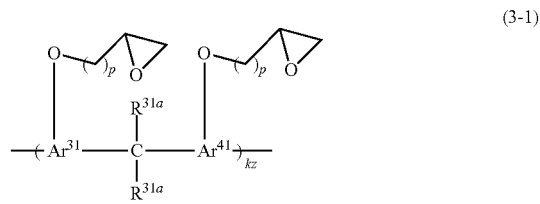

(3-1)

where each $Ar^{31}$ independently represents a benzene ring or a naphthalene ring; $Ar^{41}$ represents a benzene ring, a naphthalene ring, or a biphenyl ring; each $R^{31a}$ independently represents a hydrogen atom or a methyl group; p is an integer from 0 to 2 and preferably represents 0 or 1; kz represents an integer from 1 to 50; each ring may have a substituent besides a glycidyloxy group (e.g., an alkyl group having from 1 to 5 carbon atoms, an alkoxy group having from 1 to 5 carbon atoms, or a phenyl group); and at least one of $Ar^{31}$ or $Ar^{41}$ represents a naphthalene ring.

Specific examples of the compound represented by Formula (3-1) include compounds represented by Formula (3-2) below:

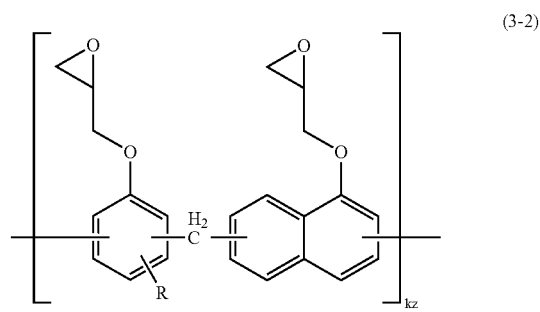

(3-2)

where R represents a methyl group; and kz is synonymous with kz in Formula (3-1) above.

A naphthalene backbone-containing polyfunctional epoxy resin that is commercially available or prepared by a known method may be used. Examples of the commercially available naphthalene backbone-containing polyfunctional epoxy resin include "HP-9540" and "HP-9500", which are products of DIC Corporation.

The naphthylene ether-based epoxy resin is preferably a compound represented by Formula (3-3) below or a compound represented by Formula (3-4) below from the viewpoints of further improving chemical resistance, adhesion to copper foil, and insulating reliability:

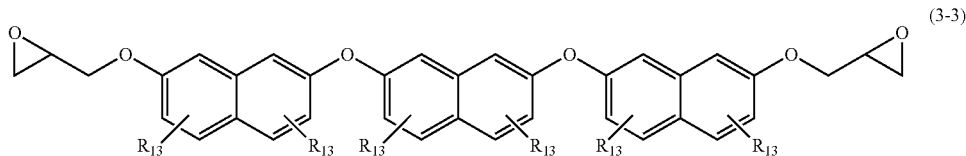
(3-3)

where each $R^{13}$ independently represents a hydrogen atom, an alkyl group having from 1 to 3 carbon atoms (e.g., a methyl group or an ethyl group), or an alkenyl group having from 2 to 3 carbon atoms (e.g., a vinyl group, an allyl group, or a propenyl group); and

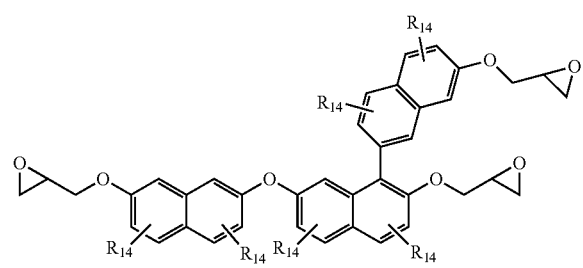
(3-4)

where each $R^{14}$ independently represents a hydrogen atom, an alkyl group having from 1 to 3 carbon atoms (e.g., a methyl group or an ethyl group), or an alkenyl group having from 2 to 3 carbon atoms (e.g., a vinyl group, an allyl group, or a propenyl group).

A naphthylene ether-based epoxy resin commercially available or prepared by a known method may be used. Examples of the commercially available naphthylene ether-based epoxy resin include "HP-6000", "EXA-7300", "EXA-7310", "EXA-7311", "EXA-7311L", "EXA7311-G3", "EXA7311-G4", "EXA-7311G4S", and "EXA-7311G5", which are products of DIC Corporation.

Dicyclopentadiene-Based Epoxy Resin

The dicyclopentadiene-based epoxy resin is not particularly limited, but examples include compounds represented by Formula (3-5) below:

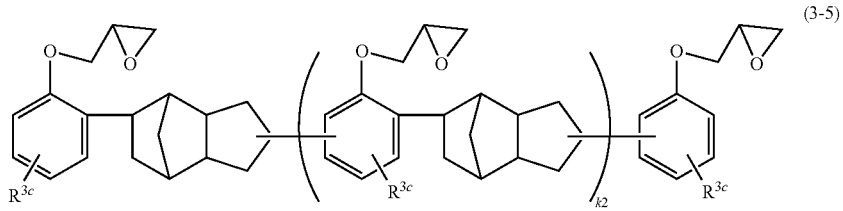
(3-5)

where each $R^{3c}$ independently represents a hydrogen atom or an alkyl group having from 1 to 5 carbon atoms; and k2 represents an integer from 0 to 10.

A dicyclopentadiene-based epoxy resin commercially available or prepared by a known method may be used. Examples of the commercially available dicyclopentadiene-based epoxy resin include "EPICRON HP-7200L", "EPICRON HP-7200", "EPICRON HP-7200H", and "EPICRON HP-7000HH", which are products of Dainippon Ink Chemical Industries, Ltd.

Epoxy Resin Constituted of Bisphenol A-Based Structural Unit and Hydrocarbon-Based Structural Unit The epoxy resin constituted of a bisphenol A-based structural unit and a hydrocarbon-based structural unit (also referred to as a "specific epoxy resin") has one or more bisphenol A-based structural units and one or more hydrocarbon-based structural units in the molecule. Examples of the specific epoxy resin include compounds represented by Formula (3e) below:

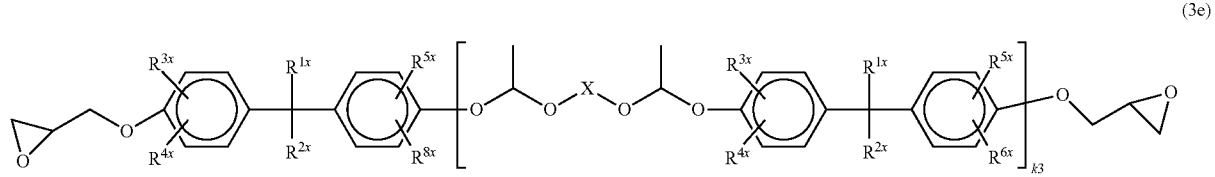
(3e)

where each of $R^{1x}$ and $R^{2x}$ independently represents a hydrogen atom or a methyl group, each of $R^{3x}$ to $R^{6x}$ independently represents a hydrogen atom, a methyl group, a chlorine atom, or a bromine atom; x represents an ethyleneoxyethyl group, a di(ethyleneoxy)ethyl group, a tri(ethyleneoxy)ethyl group, a propyleneoxypropyl group, a di(propyleneoxy)propyl group, a tri(propyleneoxy)propyl group, or an alkylene group having from 2 to 15 carbon atoms; and k3 represents a natural number.

k3 represents a natural number and is preferably from 1 to 100 and more preferably from 1 to 10.

A specific epoxy resin commercially available or prepared by a known method may be used. Examples of the commercially available specific epoxy resin include "EPICLON EXA-4850-150" and "EPICLON EXA-4816", which are products of DIC Corporation.

From the viewpoints of further improving chemical resistance, adhesion to copper foil, and insulating reliability, the content of the epoxy compound as the thermosetting resin E is preferably from 10 to 70 parts by mass, more preferably from 15 to 60 parts by mass, and even more preferably from 20 to 50 parts by mass based on 100 parts by mass of resin solids.

The thermosetting resin E may further contain an additional resin as long as the effects of the curable compositions of the first and second embodiments are not inhibited. Examples of the additional resin include oxetane resins, benzoxazine compounds, and compounds having a polymerizable unsaturated group. One of these resins is used alone, or two or more are used in combination.

Examples of the oxetane resin include oxetane; alkyl oxetanes, such as 2-methyloxetane, 2,2-dimethyloxetane, 3-methyloxetane, and 3,3-dimethyloxatane; 3-methyl-3-methoxymethyloxetane; 3,3'-di(trifluoromethyl)perfluoxetane; 2-chloromethyloxetane; 3,3-bis(chloromethyl)oxetane; and biphenyl-based oxetanes; and OXT-101 and OXT-121, which are products of Toagosei Co., Ltd.

The "benzoxazine compound" as used in the present specification is a compound having two or more dihydrobenzoxazine rings in a molecule. Examples of the benzoxazine compound include "Bisphenol F-based Benzoxazine BF-BXZ" and "Bisphenol S-based Benzoxazine BS-BXZ", which are products of Konishi Chemical Ind. Co., Ltd.

Examples of the compound having a polymerizable unsaturated group include vinyl compounds, such as ethylene, propylene, styrene, divinylbenzene, and divinylbiphenyl; (meth)acrylates of a monohydric or polyhydric alcohol, such as methyl (meth)acrylate, 2-hydroxyethyl (meth) acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth) acrylate, and dipentaerythritol hexa(meth)acrylate; epoxy (meth)acrylates, such as bisphenol A-based epoxy (meth) acrylate and bisphenol F-based epoxy (meth)acrylate; and benzocyclobutene resins.

The content of the polymer D is preferably from 5 to 50 mass %, more preferably from 10 to 45 mass %, and even more preferably from 10 to 30 mass % based on 100 mass % of resin solids. With the content of the polymer D within the above range, the curable composition tends to be able to exhibit even better miscibility, low thermal expansion, and chemical resistance in a balanced manner.

In addition, the content of the polymer D is preferably from 5 to 50 mass %, more preferably from 10 to 45 mass %, and even more preferably from 10 to 30 mass % based on a total of 100 mass % of the polymer D and the thermosetting resin E. With the content of the polymer D within the above range, the curable composition tends to be able to exhibit even better miscibility, low thermal expansion, and chemical resistance in a balanced manner.

Inorganic Filler

The curable compositions of the first and second embodiments preferably further contain an inorganic filler from the viewpoint of further improving low thermal expansion. Examples of the inorganic filler include silica, silicon compounds (e.g., such as white carbon), metal oxides (e.g., such as alumina, titanium white, zinc oxide, magnesium oxide, and zirconium oxide), metal nitrides (e.g., such as boron nitride, aggregated boron nitride, silicon nitride, and aluminum nitride), metal sulfates (e.g., such as barium sulfate), metal hydroxides (e.g., such as aluminum hydroxide, heat-treated aluminum hydroxide (e.g., those obtained by heat-treating aluminum hydroxide to remove part of crystal water), boehmite, and magnesium hydroxide), molybdenum compounds (e.g., such as molybdenum oxide and zinc molybdate), zinc compounds (e.g., such as zinc borate and zinc stannate), clay, kaolin, talc, calcined clay, calcined kaolin, calcined talc, mica, E-glass, A-glass, NE-glass, C-glass, L-glass, D-glass, S-glass, M-glass G-20, short glass fibers (including glass fine powders of E glass, T glass, D glass, S glass, Q glass, or the like), hollow glass, and spherical glass. One of these inorganic fillers is used alone, or two or more are used in combination. Among these inorganic fillers, from the viewpoint of further improving low thermal expansion, the inorganic filler is preferably at least one selected from the group consisting of metal hydroxides and metal oxides, more preferably contains at least one selected from the group consisting of silica, boehmite, and alumina, and even more preferably is silica.

Examples of the silica include natural silica, fused silica, synthetic silica, Aerosil, and hollow silica. One of these silicas is used alone, or two or more are used in combination. Among these silicas, fused silica is preferable from the viewpoint of dispersibility, and two or more fused silicas having different particle sizes are more preferable from the viewpoints of filling properties and fluidity.

From the viewpoint of further improving low thermal expansion, the content of the inorganic filler is preferably from 50 to 1000 parts by mass, more preferably from 70 to 500 parts by mass, and even more preferably from 100 to 300 parts by mass based on 100 parts by mass of resin solids.

Silane Coupling Agent

The curable compositions of the first and second embodiments may further contain a silane coupling agent. The curable compositions of the first and second embodiments containing a silane coupling agent tend to be able to further improve the dispersibility of the inorganic filler and adhesion strength between the components of the curable compositions of the first and second embodiments and a base material described later.

The silane coupling agent is not particularly limited, and examples include silane coupling agents commonly used in surface treatment of inorganic materials including aminosilane-based compounds (e.g., such as γ-aminopropyltriethoxysilane, N-(β-(aminoethyl)-γ-aminopropyltrimethoxysilane), epoxysilane-based compounds (e.g., such as γ-glycidoxypropyltrimethoxysilane), acrylic silane-based compounds (e.g., such as γ-acryloxypropyltrimethoxysilane), cationic silane-based compounds (e.g., such as N-β-(N-vinylbenzylaminoethyl)-γ-aminopropyltrimethoxysilane hydrochloride), styryl silane-based compounds, and phenyl-silane-based compounds. One of the silane coupling agents is used alone, or two or more are used in combination. Among these, the silane coupling agent is preferably an epoxysilane-based compound. Examples of the epoxysilane-based compound include "KBM-403", "KBM-303", "KBM-402", and "KBE-403", which are products of Shin-Etsu Chemical Co., Ltd.

The content of the silane coupling agent is not particularly limited but may be from 0.1 to 5.0 parts by mass based on 100 parts by mass of resin solids.

Wet Dispersant

The curable compositions of the first and second embodiments may further contain a wet dispersant. The curable compositions of the first and second embodiments containing a wet dispersant tend to further improve the dispersibility of the filler.

The wet dispersant is any known dispersant (dispersion stabilizer) used to disperse a filler, and examples include DISPER BYK-110, 111, 118, 180, 161, BYK-W996, W9010, and W903 available from BYK Japan KK.

The content of the wet dispersant is not particularly limited but is preferably 0.5 parts by mass or larger and 5.0 parts by mass or less based on 100 parts by mass of resin solids.

Solvent

The curable compositions of the first and second embodiments may further contain a solvent. The curable compositions of the first and second embodiments containing a solvent tend to have a reduced viscosity when preparing the curable composition, further improve handleability (ease of handling), and further improve impregnability to a base material.

The solvent is not particularly limited as long as the solvent can dissolve part or all of each component in the curable composition, but examples include ketones (such as acetone and methyl ethyl ketone), aromatic hydrocarbons (e.g., such as toluene and xylene), amides (e.g., such as dimethyl formaldehyde), propylene glycol monomethyl ether, and propylene glycol monomethyl ether and acetate thereof. One of these solvents is used alone, or two or more are used in combination.

Examples of a method for producing the curable compositions of the first and second embodiments include a method of collectively or sequentially blending the components to a solvent and stirring the mixture. Here, a known process, such as stirring, mixing, and kneading, is used to uniformly dissolve or disperse the components.

Applications

The curable composition of the present embodiment can exhibit excellent miscibility, low thermal expansion, and chemical resistance as described above. Thus, the curable composition of the present embodiment is suitably used in a metal foil-clad laminate and a printed wiring board.

Prepreg

A prepreg of the present embodiment includes a base material and the curable composition of the present embodiment with which the base material is impregnated or coated. The prepreg may be obtained by a known method as described above, and specifically, the prepreg is obtained by impregnating or coating a base material with the curable composition of the present embodiment and then heat-drying the base material under conditions at 100 to 200° C. to semi-cure (B-staging) the composition.

The prepreg of the present embodiment also includes a form of a cured product obtained by heat-curing a semi-cured prepreg under conditions at a heating temperature of 180 to 230° C. for a heating time of 60 to 180 minutes.

The content of the curable composition in the prepreg is preferably from 30 to 90 vol. %, more preferably from 35 to 85 vol. %, and even more preferably from 40 to 80 vol. % based on a total amount of the prepreg based on the solids in the prepreg. The prepreg having a content of the curable composition within the above range tends to improve moldability. The solids in the prepreg refer to the components excluding the solvent from the prepreg, and for example, the filler is included in the solids of the prepreg.

The base material is not particularly limited, and examples include known base materials used in materials for various printed wiring boards. Specific examples of the base material include glass base materials, inorganic base materials other than glass (e.g., inorganic base materials constituted of an inorganic fiber other than glass, such as quartz), and organic base materials (e.g., organic base materials constituted of an organic fiber, such as a wholly aromatic polyamide, polyester, poly(para-phenylene benzoxazole), or polyimide). One of these base materials is used alone, or two or more are used in combination. Among these base materials, from the viewpoint of even better dimensional stability under heat, a glass base material is preferred.

Examples of the fiber constituting the glass base material include fibers of E glass, D glass, S glass, T glass, Q glass, L glass, NE glass, HME glass, or the like. Among these fibers, from the viewpoints of even better strength and low water absorbance, the fiber constituting the glass base material is preferably a fiber of one or more selected from the group consisting of E glass, D glass, S glass, T glass, Q glass, L glass, NE glass, and HME glass.

The form of the base material is not particularly limited, but examples include forms of woven fabrics, nonwoven fabrics, rovings, chopped strand mats, and surfacing mats. The weave of the woven fabric is not particularly limited, but known examples include plain weave, mat weave, and twill weave, and the weave can be appropriately selected and used from these known weaves according to the intended application or performance. In addition, a material obtained by subjecting these to fiber opening, or a glass woven fabric surface-treated with a silane coupling agent is suitably used. The thickness and mass of the base material are not particularly limited, but typically, a base material with a thickness of approximately from 0.01 to 0.1 mm is suitably used.

A resin sheet of the present embodiment includes a support and the curable composition of the present embodiment disposed on a surface of the support. The resin sheet of the present embodiment may be formed, for example, by applying the curable composition of the present embodiment on one or both sides of the support. The resin sheet of the present embodiment can be produced, for example, by applying the curable composition used in the prepreg or the like directly on the support, such as a metal foil or a film, and drying.

The support is not particularly limited, but for example, a known support used in various printed wiring board materials can be used, and a resin sheet or a metal foil is preferred. Examples of the resin sheet and the metal foil include resin sheets, such as a polyimide film, a polyamide film, a polyester film, a polyethylene terephthalate (PET) film, a polybutylene terephthalate (PBT) film, a polypropylene (PP) film, and a polyethylene (PE) film; and metal foils, such as an aluminum foil, a copper foil, and a gold foil. Among these, the support is preferably an electrolytic copper foil or a PET film.

The resin sheet of the present embodiment is obtained, for example, by applying the curable composition of the present embodiment on a support and then semi-curing (B-staging) the composition. A method for producing the resin sheet of the present embodiment is preferably a method for producing a composite of a B-staged resin and a support. Specifically, examples include a method of applying the curable composition described above on a support, such as a copper foil, then semi-curing the composition by such a process as heating in a dryer at 100 to 200° C. for 1 to 60 minutes to produce the resin sheet. The amount of the curable composition deposited onto the support is preferably in a range of 1.0 μm or larger and 300 μm or less in terms of resin thickness of the resin sheet. The resin sheet of the present embodiment can be used as a build-up material for a printed wiring board.

Metal Foil-Clad Laminate

A metal foil-clad laminate of the present embodiment includes a laminate formed of one or more selected from the group consisting of the prepreg or resin sheet of the present embodiment, and a metal foil disposed on one or both sides of the laminate. The laminate may be formed of one prepreg or resin sheet and may be formed of a plurality of prepregs and/or resin sheets.

The metal foil (a conductor layer) is any metal foil used in various printed wiring board materials, and examples include metal foils, such as a copper foil and an aluminum foil, and examples of the copper foil include a rolled copper foil and an electrolytic copper foil. The thickness of the conductor layer is, for example, from 1 to 70 μm and preferably from 1.5 to 35 μm.

A method for molding the metal foil-clad laminate and the molding conditions are not particularly limited, and a common technique and conditions for laminates for printed wiring boards and multilayer boards can be applied. For example, for molding the laminate or metal foil-clad laminate, a multi-stage press, a multi-stage vacuum press, a continuous molding machine, an autoclave molding machine, or the like can be used. In addition, for molding (lamination molding) the laminate or metal foil-clad laminate, typically a temperature is from 100 to 300° C., a surface pressure is from 2 to 100 kgf/cm$^2$, and a heating time is in a range of 0.05 to 5 hours. Furthermore, post-curing can be also performed at a temperature of 150 to 300° C. as necessary. In particular, when a multi-stage press is used, from the viewpoint of sufficiently accelerating curing of the prepreg, a temperature of 200° C. to 250° C., a pressure of 10 to 40 kgf/cm$^2$, a heating time of 80 minutes to 130 minutes are preferred, and a temperature of 215° C. to 235° C., a pressure of 25 to 35 kgf/cm$^2$, and a heating time of 90 minutes to 120 minutes are more preferred. In addition, also a multilayer board can be formed by lamination molding the prepreg described above and a separately produced wiring board for an inner layer in combination.

Printed Wiring Board

A printed wiring board of the present embodiment has an insulating layer formed of one or more selected from the group consisting of the prepreg or resin sheet of the present embodiment, and a conductor layer formed on a surface of the insulating layer. The printed wiring board of the present embodiment can be formed, for example, by etching a predetermined wiring pattern on the metal foil of the metal foil-clad laminate of the present embodiment to form a conductor layer.

The printed wiring board of the present embodiment can be produced, specifically, by the following method, for example. First, the metal foil-clad laminate of the present embodiment is prepared. A predetermined wiring pattern is etched on the metal foil of the metal foil-clad laminate to produce an inner layer base material having a conductor layer (inner layer circuit). Then, a predetermined number of insulating layers and a metal foil for an outer layer circuit are layered in this order on the conductor layer (interior circuit) surface of the inner layer base material and integrally molded (lamination molded) under heat and pressure to obtain a laminate. The method for the lamination molding and the molding conditions are the same as the method for lamination molding and the molding conditions for the laminate and metal foil-clad laminate described above. Then, the laminate is subjected to hole formation for a through hole or a via hole, and a plated metal film, which allows conduction between the conductor layer (interior circuit) and the metal foil for the outer layer circuit, is formed on a wall surface of the hole thus formed. Then, a predetermined wiring pattern is etched on the metal foil for the outer layer circuit to produce an outer layer base material having a conductor layer (outer layer circuit). The printed wiring board is thus produced.

In addition, when the metal foil-clad laminate is not used, a conductor layer serving as a circuit may be formed in the insulating layer to produce the printed wiring board. Here, an electroless plating technique can be used to form the conductor layer.

EXAMPLES

Hereinafter, the present invention will be described in further detail with reference to examples, but the present invention is not limited to these examples.

Synthesis Example 1

Synthesis of 1-naphthol aralkyl-based cyanate ester compound (SN495V-CN)

First, 300 g (1.28 mol in terms of an OH group) of an α-naphthol aralkyl-based phenolic resin (SN495V, an OH group mol equivalent of 236 g/eq., available from Nippon Steel Chemical Co., Ltd.) in which each $R^{2a}$ in Formula (2b) above is a hydrogen atom and 194.6 g (1.92 mol) (1.5 mol based on 1 mol of hydroxy groups) of triethylamine were dissolved in 1800 g of dichloromethane, and this solution was designated as a solution 1. While a mixture of 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were stirred and a liquid temperature of −2 to −0.5° C. was maintained, the solution 1 was poured over 30 minutes. After the completion of pouring the solution 1, the mixture was stirred at the same temperature for 30 minutes, and then a solution (solution 2) in which 65 g (0.64 mol) (0.5 mol based on 1 mol of hydroxy groups) of triethylamine was dissolved in 65 g of dichloromethane was poured over 10 minutes. After the completion of pouring the solution 2, the mixture was stirred at the same temperature for 30 minutes and the reaction was completed. The reaction liquid was then allowed to stand, and the organic phase and the aqueous phase were separated. The resulting organic phase was washed with 1300 g of water 5 times, and the electrical conductivity of the waste water at the fifth water washing was 5 μS/cm, confirming that a removable ionic compound was sufficiently removed by washing with water. The organic phase after water washing was concentrated under reduced pressure, finally concentrated to dryness at 90° C. for 1 hour, and 331 g of the target naphthol aralkyl-based cyanate ester compound (SN495V-CN, a cyanate ester group mol equivalent of 261 g/eq.) (an orange, viscous material) was obtained. The IR absorption spectrum of the resulting SN495V-CN showed an absorption at 2250 cm$^{-1}$ (a cyanate ester group) and no absorption of a hydroxy group.

Example 1

To a three-necked flask equipped with a thermometer and a Dimroth condenser, 5.3 parts by mass of diallyl bisphenol A (DABPA, Daiwa Kasei Industry Co., Ltd.), 5.8 parts by mass of biscresol fluorene (BCF, Osaka Gas Chemicals Co., Ltd.), 4.4 parts by mass of an epoxy-modified silicone b1 (X-22-163, Shin-Etsu Chemical Co., Ltd., a functional group mol equivalent of 200 g/mol), 8.7 parts by mass of an epoxy-modified silicone b2 (KF-105, Shin-Etsu Chemical Co., Ltd., a functional group mol equivalent of 490 g/mol), 5.8 parts by mass of a biphenyl-based epoxy compound c1 (YL-6121 H, Mitsubishi Chemical Corporation), and 30 parts by mass of propylene glycol monomethyl ether acetate (DOWANOL PMA, Dow Chemical Japan Limited) as a solvent were added, and heated under stirring to 120° C. in an oil bath. The raw materials were confirmed to be dissolved in the solvent, and 0.3 parts by mass of an imidazole catalyst g1 (TBZ, Shikoku Chemicals Corporation) was added. The temperature was increased to 140° C., then the mixture was stirred for 5 hours, and after cooling, a phenoxy polymer solution (a solid content of 50 mass %) was obtained (a polymer production process).

The diallyl bisphenol A corresponds to the "alkenyl phenol A", the epoxy-modified silicone b1 and the epoxy-modified silicone b2 correspond to the "epoxy-modified silicone B", and the biphenyl-based epoxy compound c1 corresponds to the "epoxy compound C". In addition, the phenoxy polymer solution contains a polymer D containing a constituent unit derived from the alkenyl phenol A, a constituent unit derived from the epoxy-modified silicone B, and a constituent unit derived from the epoxy compound C. Hereinafter, the polymer D is also referred to as a phenoxy polymer.

To 30 parts by mass of this phenoxy polymer solution (in terms of solid content), 26 parts by mass of the α-naphthol aralkyl-based cyanate ester compound obtained by Synthesis Example 1, 17 parts by mass of a novolac-based maleimide compound (BMI-2300, Daiwa Kasei Industry Co., Ltd.), 27 parts by mass of a naphthylene ether-based epoxy compound (HP-6000, DIC Corporation), 100 parts by mass of a spherical silica (SFP-130MC, Denka Company Limited), 40 parts by mass of a spherical silica (SC-4500SQ, Admatechs Company Limited), 1 part by mass of a wet dispersant (DISPERBYK-161, BYK Japan KK), and 5 parts by mass of a silane coupling agent (KMB-403, Shin-Etsu Chemical Co., Ltd.) were mixed, and a varnish was obtained (a varnish production process). An S glass woven fabric (a thickness of 100 µm) was impregnated and coated with the varnish, heat-dried at 150° C. for 3 minutes, and a prepreg with a content of resin composition solids (including fillers) of 46 mass % was obtained (a prepreg production process).

Example 2

A prepreg with a content of resin composition solids (including fillers) of 46 mass % was obtained in the same manner as in Example 1 with the exception that, in the polymer production process, the amount of the imidazole catalyst g1 added was 1.2 parts by mass in place of 0.3 parts by mass.

Example 3

A prepreg with a content of resin composition solids (including fillers) of 46 mass % was obtained in the same manner as in Example 1 with the exception that, in the polymer production process, the amount of the diallyl bisphenol A added was 5.0 parts by mass in place of 5.3 parts by mass, the amount of biscresol fluorene added was 5.5 parts by mass in place of 5.8 parts by mass, the amount of the epoxy-modified silicone b1 added was 3.7 parts by mass in place of 4.4 parts by mass, the amount of the epoxy-modified silicone b2 added was 11 parts by mass in place of 8.7 parts by mass, the amount of the biphenyl-based epoxy compound c1 added was 4.9 parts by mass in place of 5.8 parts by mass, and the amount of the imidazole catalyst g1 added was 1.2 parts by mass in place of 0.30 parts by mass.

Example 4

A prepreg with a content of resin composition solids (including fillers) of 46 mass % was obtained in the same manner as in Example 1 with the exception that, in the polymer production process, 1.2 parts by mass of an imidazole catalyst g2 (TPIZ, Tokyo Chemical Industry Co., Ltd.) was added in place of adding 0.3 parts by mass of the imidazole catalyst g1.

Example 5

A prepreg with a content of resin composition solids (including fillers) of 46 mass % was obtained in the same manner as in Example 1 with the exception that, in the polymer production process, 5.8 parts by mass of a biphenyl-based epoxy compound c2 (YX-4000, Mitsubishi Chemical Corporation) was added in place of adding 5.8 parts by mass of the biphenyl-based epoxy compound c1. The biphenyl-based epoxy compound c2 corresponds to the "epoxy compound C".

Example 6

A prepreg with a content of resin composition solids (including fillers) of 46 mass % was obtained in the same manner as in Example 1 with the exception that, in the polymer production process, the amount of the diallyl bisphenol A added was 10 parts by mass in place of 5.3 parts by mass, biscresol fluorene was not added, the amount of the epoxy-modified silicone b1 added was 4.5 parts by mass in place of 4.4 parts by mass, the amount of the epoxy-modified silicone b2 added was 9.1 parts by mass in place of 8.7 parts by mass, the amount of the biphenyl-based epoxy compound c1 added was 6.0 parts by mass in place of 5.8 parts by mass, and the amount of the imidazole catalyst g1 added was 1.2 parts by mass in place of 0.3 parts by mass.

Example 7

A prepreg with a content of resin composition solids (including fillers) of 46 mass % was obtained in the same manner as in Example 3 with the exception that, in the polymer production process, the amount of the epoxy-modified silicone b2 added was 7.0 parts by mass in place of 11 parts by mass, and 4.0 parts by mass of an epoxy-modified silicone b3 (X-22-163A, Shin-Etsu Chemical Co., Ltd., a functional group mol equivalent of 1000 g/mol) was added. The epoxy-modified silicone b3 corresponds to the "epoxy-modified silicone B".

Example 8

A phenoxy polymer solution (a solid content of 50 mass %) was obtained in the same manner as in Example 1 with the exception that, in the polymer production process, the amount of the diallyl bisphenol A added was 1.7 parts by mass in place of 5.3 parts by mass, the amount of biscresol fluorene added was 1.8 parts by mass in place of 5.8 parts by mass, the amount of the epoxy-modified silicone b1 added was 1.2 parts by mass in place of 4.4 parts by mass, the amount of the epoxy-modified silicone b2 added was 3.7 parts by mass in place of 8.7 parts by mass, the amount of the biphenyl-based epoxy compound c1 added was 1.6 parts by mass in place of 5.8 parts by mass, the amount of the solvent added was 10 parts by mass in place of 30 parts by mass, and the amount of the imidazole catalyst g1 added was 0.4 parts by mass in place of 0.3 parts by mass. A prepreg with a content of resin composition solids (including fillers) of 46 mass % was obtained in the same manner as in Example 1 with the exception that, in the varnish production process and the prepreg production process, the amount of the α-naphthol aralkyl-based cyanate ester compound added was 33 parts by mass in place of 26 parts by mass, the amount of the novolac-based maleimide compound added was 22 parts by mass in place of 17 parts by mass, and the amount of the naphthylene ether-based epoxy compound added was 35 parts by mass in place of 27 parts by mass.

Example 9

A prepreg with a content of resin composition solids (including fillers) of 46 mass % was obtained in the same manner as in Example 3 with the exception that, in the varnish production process, the amount of the α-naphthol aralkyl-based cyanate ester compound added was 50 parts by mass in place of 26 parts by mass, the novolac-based maleimide compound was not added, and the amount of the naphthylene ether-based epoxy compound added was 50 parts by mass in place of 27 parts by mass.

Example 10

A prepreg with a content of resin composition solids (including fillers) of 46 mass % was obtained in the same manner as in Example 3 with the exception that, in the varnish production process, the α-naphthol aralkyl-based cyanate ester compound was not added, the amount of the novolac-based maleimide compound added was 40 parts by mass in place of 17 parts by mass, the naphthylene ether-based epoxy compound was not added, and 30 parts by mass of an alkenyl-substituted nadimide (BANI-M, Maruzen Petrochemical Co., Ltd.) was added.

Example 11

A prepreg with a content of resin composition solids (including fillers) of 46 mass % was obtained in the same manner as in Example 3 with the exception that, in the varnish production process, the α-naphthol aralkyl-based cyanate ester compound was not added, the amount of the novolac-based maleimide compound added was 18 parts by mass in place of 17 parts by mass, the amount of the naphthylene ether-based epoxy compound added was 26 parts by mass in place of 27 parts by mass, and 26 parts by mass of a phenolic compound (GPH-103, Nippon Kayaku Co., Ltd.) was added.

Comparative Example 1

A varnish was obtained by mixing 37 parts by mass of the α-naphthol aralkyl-based cyanate ester compound obtained by Synthesis Example 1, 24 parts by mass of a novolac-based maleimide compound (BMI-2300, Daiwa Kasei Industry Co., Ltd.), 39 parts by mass of a naphthylene ether-based epoxy compound (HP-6000, DIC Corporation), 100 parts by mass of a spherical silica (SFP-130MC, Denka Company Limited), 40 parts by mass of a spherical silica (SC-4500SQ, Admatechs Company Limited), 1 part by mass of a wet dispersant (DISPERBYK-161, BYK Japan KK), and 5 parts by mass of a silane coupling agent (KMB-403, Shin-Etsu Chemical Co., Ltd.). An S glass woven fabric (a thickness of 100 μm) was impregnated and coated with the varnish, heat-dried at 150° C. for 3 minutes, and a prepreg with a content of resin composition solids (including fillers) of 46 mass % was obtained.

Comparative Example 2

A prepreg with a content of resin composition solids (including fillers) of 46 mass % was obtained in the same manner as in Example 1 with the exception that, in the polymer production process, the amount of the diallyl bisphenol A added was 10 parts by mass in place of 5.3 parts by mass, biscresol fluorene and the epoxy-modified silicone b1 were not added, the amount of the epoxy-modified silicone b2 added was 20 parts by mass in place of 8.7 parts by mass, the biphenyl-based epoxy compound c1 was not added, and the amount of the imidazole catalyst g1 added was 1.2 parts by mass in place of 0.3 parts by mass.

Comparative Example 3

A prepreg with a content of resin composition solids (including fillers) of 46 mass % was obtained in the same manner as in Example 1 with the exception that, in the polymer production process, the amount of the diallyl bisphenol A added was 17 parts by mass in place of 5.3 parts by mass, biscresol fluorene was not added, the amount of the epoxy-modified silicone b1 added was 4.5 parts by mass in place of 4.4 parts by mass, the amount of the epoxy-modified silicone b2 added was 9.0 parts by mass in place of 8.7 parts by mass, the biphenyl-based epoxy compound c1 was not added, and the amount of the imidazole catalyst g1 added was 1.2 parts by mass in place of 0.3 parts by mass.

Comparative Example 4

A prepreg with a content of resin composition solids (including fillers) of 46 mass % was obtained in the same manner as in Example 4 with the exception that, in the polymer production process, 5.8 parts by mass of a maleimide compound (BMI-70, K-I Chemical Industry Co., Ltd.) was added in place of adding 5.8 parts by mass of the biphenyl-based epoxy compound c1.

Comparative Example 5

A prepreg with a content of resin composition solids (including fillers) of 46 mass % was obtained in the same manner as in Example 1 with the exception that, in the polymer production process, the amount of the diallyl bisphenol A added was 15 parts by mass in place of 5.3 parts by mass, biscresol fluorene, the epoxy-modified silicone b1 and the epoxy-modified silicone b2 were not added, the amount of the biphenyl-based epoxy compound c1 added was 15 parts by mass in place of 5.8 parts by mass, and the amount of the imidazole catalyst g1 added was 1.2 parts by mass in place of 0.3 parts by mass.

Comparative Example 6

A varnish was obtained by mixing 30 parts by mass of an epoxy-modified silicone b1, 26 parts by mass of the α-naphthol aralkyl-based cyanate ester compound obtained by Synthesis Example 1, 17 parts by mass of a novolac-based maleimide compound (BMI-2300, Daiwa Kasei Industry Co., Ltd.), 27 parts by mass of a naphthylene ether-based epoxy compound (HP-6000, DIC Corporation), 100 parts by mass of a spherical silica (SFP-130MC, Denka Company Limited), 40 parts by mass of a spherical silica (SC-4500SQ, Admatechs Company Limited), 1 part by mass of a wet dispersant (DISPERBYK-161, BYK Japan KK), and 5 parts by mass of a silane coupling agent (KMB-403, Shin-Etsu Chemical Co., Ltd.). An S glass woven fabric (a thickness of 100 μm) was impregnated and coated with the varnish, heat-dried at 150° C. for 3 minutes, and a prepreg with a content of resin composition solids (including fillers) of 46 mass % was obtained.

Comparative Example 7

A prepreg with a content of resin composition solids (including fillers) of 46 mass % was obtained in the same manner as in Comparative Example 6 with the exception that 30 parts by mass of an epoxy-modified silicone b2 (KF-105, Shin-Etsu Chemical Co., Ltd., a functional group mol equivalent of 490 g/mol) was added in place of adding 30 parts by mass of the epoxy-modified silicone b1.

Comparative Example 8

A prepreg with a content of resin composition solids (including fillers) of 46 mass % was obtained in the same manner as in Comparative Example 6 with the exception that 30 parts by mass of an epoxy-modified silicone b3 (X-22-163A, Shin-Etsu Chemical Co., Ltd., a functional group mol equivalent of 1000 g/mol) was added in place of adding 30 parts by mass of the epoxy-modified silicone b1.

Various physical properties of the phenoxy polymers obtained in each of examples and comparative examples are shown in Table 1. The weight average molecular weight shown in Table 1 was determined by GPC using polystyrene as a standard material.

Appearance Evaluation of Phenoxy Polymer Solution

The phenoxy polymer solution obtained in each of Examples 1 to 11 and Comparative Examples 1 to 5 was visually observed. The phenoxy polymer solution of each of Examples 1 to 11 and Comparative Examples 1 and 5 was homogeneous, but the phenoxy polymer solutions of Comparative Examples 2 and 3 separated into 2 phases, and the phenoxy polymer solution of Comparative Example 4 gelled.

Appearance Evaluation of Varnish and Prepreg

The appearances of the varnish and prepreg of each of Examples 1 to 11 and Comparative Examples 1 to 8 were visually evaluated according to the following evaluation criteria.

Good: Homogeneous appearance was observed.

Poor: Nonhomogeneous appearance was observed.

Production of Metal Foil-Clad Laminate

A copper-clad laminate including an insulating layer having a thickness of 0.2 mm or 0.8 mm was obtained as a metal foil-clad laminate by layering 2 or 8 prepregs obtained in each of Examples 1 to 11 and Comparative Examples 1 to 8, further disposing an electrolytic copper foil having a thickness of 12 μm (3EC-M2S-VLP available from Mitsui Mining & Smelting Co., Ltd.) on top and bottom of the layered prepregs, and performing lamination molding at a pressure of 30 kgf/cm$^2$ and a temperature of 220° C. for 120 minutes. The prepregs of Comparative Examples 4 and 6 to 8 failed to produce the copper-clad laminate. Properties of the resulting copper-clad laminates were evaluated according to the methods described below. The evaluation results are shown in Table 1.

Coefficient of Thermal Expansion

The coefficient of linear thermal expansion in the longitudinal direction of the glass cloth was measured for the insulating layer of the laminate in accordance with the thermo-mechanical analysis (TMA) method specified in JIS C 6481. Specifically, the copper foils on both sides of the copper-clad laminate obtained above (5 mm×5 mm×0.8 mm) were removed by etching, and then the laminate was heated in a constant temperature oven at 220° C. for 2 hours to remove stress due to molding. Then, the coefficient of linear thermal expansion (CTE) (ppm/° C.) from 60° C. to 260° C. was measured by increasing the temperature from 40° C. to 320° C. at 10° C. per minute using a thermal mechanical analyzer (available from TA Instruments).

Copper Foil Peel Strength (Adhesion to Copper Foil)

The copper foil peel strength (adhesion to copper foil) was measured in accordance with JIS C6481 using the copper foil-clad laminate (30 mm×150 mm×0.8 mm) obtained by the above method. Delamination occurred in the copper foil-clad laminate produced from the prepreg of Comparative Example 2 during the measurement, and thus the laminate failed to be measured.

Desmear Resistance

The copper foils on both sides of the copper foil-clad laminate obtained above (50 mm×50 mm×0.2 mm) were removed by etching, then the laminate was immersed in Swelling Dip Securiganth P of Atotech Japan K.K., which was a swelling liquid, at 80° C. for 10 minutes, then immersed in Concentrate Compact CP of Atotech Japan K.K., which was a roughening liquid, at 80° C. for 5 minutes, and finally immersed in Reduction Conditioner Securiganth P500 of Atotech Japan K.K., which was a neutralization liquid, at 45° C. for 10 minutes. This treatment was repeated three times. The masses of the metal foil-clad laminate before and after the treatment were measured, and the mass loss was determined. A smaller absolute value of mass loss indicates superior desmear resistance.

Insulating Reliability

Insulating reliability was evaluated by a test of insulating reliability between wires according to the highly accelerated stress test (HAST). First, a printed wiring board (line & space (L/S=100/100 μm)) was formed by a subtractive method from the copper-clad laminate obtained above (an insulating layer thickness of 0.2 mm). A power source was then connected to the wiring, and the continuous wet insulation resistance was evaluated under conditions of a temperature of 130° C., a humidity of 85%, and an applied voltage of 5 VDC. A printed wiring board with a resistance value of $1.0 \times 10^8 \Omega$ was determined as failure. The evaluation criteria were as follows.

Good: No failure was found at 500 hours or longer

Poor: Failure was found at shorter than 500 hours

TABLE 1

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Properties of D | Weight average molecular weight | 4209 | 9221 | 6330 | 11607 | 8920 | 6842 | 6487 | 6330 | 6330 | 6330 | 6330 |
| | Alkenyl group mol equivalent | 872 | 872 | 927 | 872 | 982 | 444 | 922 | 906 | 927 | 927 | 927 |
| | Number of epoxy groups/number of phenolic groups | 1.11 | 1.11 | 1.11 | 1.11 | 1.11 | 1.16 | 1.05 | 1.11 | 1.11 | 1.11 | 1.11 |
| | B/D (mass %) | 43.5 | 43.5 | 48.8 | 43.5 | 43.5 | 45.3 | 48.8 | 48.8 | 48.8 | 48.8 | 48.8 |
| | C/(B + C) | 30.8 | 30.8 | 25 | 30.8 | 30.8 | 30.8 | 25 | 25 | 25 | 25 | 25 |
| Appearance | Varnish | Good | Good | Good | Good | Good | Good | Good | Good | Good | Good | Good |
| | Prepreg (cured product) | Good | Good | Good | Good | Good | Good | Good | Good | Good | Good | Good |
| Product properties | CTE (ppm) | 6.5 | 6.5 | 6 | 6.5 | 6.5 | 6.5 | 5.5 | 8 | 7 | 6 | 7 |
| | Adhesion to copper foil (kN/m) | 0.6 | 0.65 | 0.63 | 0.62 | 0.62 | 0.58 | 0.6 | 0.78 | 0.75 | 0.5 | 0.75 |
| | Desmear resistance (mg) | −15.7 | −13.2 | −12.3 | −17.4 | −14.2 | −16.8 | −18.7 | −6.5 | −14.4 | −18.6 | −13.2 |
| | Insulation reliability | Good | Good | Good | Good | Good | Good | Good | Good | Good | Good | Good |

*In the table, "Number of epoxy groups/number of phenolic groups" refers to the total number of epoxy groups of the epoxy-modified silicone B and the epoxy compound C based on the number of phenolic groups of the alkenyl phenol A used in the preparation of the polymer D.

*In the table, "B/D" represents the content (mass %) of the constituent unit derived from the epoxy-modified silicone B based on the polymer D in the phenoxy polymer solution, and the polymer D does not include the imidazole catalyst and the solvent.

*In the table, "C/(B + C)" represents the content (mass %) of the constituent unit derived from the epoxy compound C based on a total amount of the constituent unit derived from the epoxy-modified silicone B and the constituent unit derived from the epoxy compound C.

TABLE 2

| | | Comparative Examples | | | | | | | |
|---|---|---|---|---|---|---|---|---|---|
| | | 1 | 2 | 3 | 4 | 5 | 6 | 7 | 8 |
| Properties of D | Weight average molecular weight | — | — | — | — | 10254 | — | — | — |
| | Alkenyl group mol equivalent | — | 220 | 280 | 872 | 308 | — | — | — |
| | Number of epoxy groups/number of phenolic groups | — | 0.63 | 0.37 | — | 0.88 | — | — | — |
| | B/D (mass%) | — | 66.7 | 45 | 43.6 | 0 | — | — | — |
| | C/(B + C) | — | — | — | — | 100 | — | — | — |
| Appearance | Varnish | Good | Poor | Poor | Poor | Good | Good | Poor | Poor |
| | Prepreg (cured product) | Good | Poor | Poor | Poor | Good | Failed to be produced | Poor | Poor |
| Product properties | CTE (PPm) | 10 | 6.5 | 6.5 | Failed to be produced | 12 | Failed to be produced | Failed to be produced | Failed to be produced |
| | Adhesion to copper foil (kN/m) | 0.8 | Delamination | 0.1 | Failed to be produced | 1 | Failed to be produced | Failed to be produced | Failed to be produced |
| | Desmear resistance (mg) | −5.2 | −142 | −125 | — | −21.4 | — | — | — |
| | Insulation reliability | Good | Poor | Poor | — | Good | — | — | — |

*In the table, "Failed to be produced" means that a prepreg that deserves evaluation could not be produced because the phenoxy polymer solution separated into two phases or formed gels (Comparative Examples 2 to 4), or the epoxy-modified silicone B and another thermosetting resin were not miscible.

The present application is based on Japanese Patent Application (JP 2018-140494) filed with the Japan Patent Office on Jul. 26, 2018, the contents of which are incorporated herein by reference.

INDUSTRIAL APPLICABILITY

The present invention has industrial applicability as a curable composition used as a material for a prepreg, a resin sheet, a metal foil-clad laminate, a printed wiring board, and the like.

The invention claimed is:
1. A curable composition comprising:
an alkenyl phenol A, an epoxy-modified silicone B, and an epoxy compound C other than the epoxy-modified silicone B, and
wherein an average number of a phenolic group per molecule of the alkenyl phenol A is 1 or larger and less than 3, an average number of an epoxy group per molecule of the epoxy-modified silicone B is 1 or larger and less than 3, and an average number of an epoxy group per molecule of the epoxy compound C is 1 or larger and less than 3.
2. The curable composition according to claim 1, wherein the alkenyl phenol A contains a diallyl bisphenol and/or a dipropenyl bisphenol.
3. The curable composition according to claim 1, wherein the epoxy-modified silicone B contains an epoxy-modified silicone having 140 to 250 g/mol of an epoxy group mol equivalent.
4. The curable composition according to claim 1, wherein the epoxy-modified silicone B contains an epoxy-modified silicone represented by Formula (1):

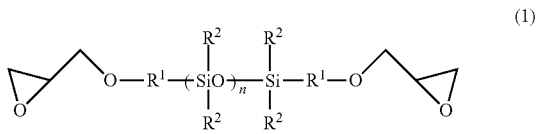

where each $R^1$ independently represents an alkylene group, a phenylene group, or an aralkylene group; each $R^2$ independently represents an alkyl group having from 1 to 10 carbon atoms, or a phenyl group; and n represents an integer of 1 or larger.
5. The curable composition according to claim 1, wherein the epoxy compound C contains an epoxy compound represented by Formula (2):

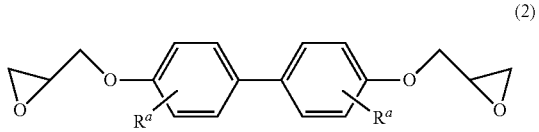

where each $R^a$ independently represents an alkyl group having from 1 to 10 carbon atoms, or a hydrogen atom.
6. The curable composition according to claim 1, wherein a content of the epoxy compound C is from 5 to 50 mass % based on a total amount of 100 mass % of the epoxy-modified silicone B and the epoxy compound C.
7. A curable composition comprising a polymer D containing a constituent unit derived from the alkenyl phenol A, a constituent unit derived from the epoxy-modified silicone B, and a constituent unit derived from the epoxy compound C, and
wherein a weight average molecular weight of the polymer D is from $3.0 \times 10^3$ to $5.0 \times 10^4$.
8. The curable composition according to claim 7, wherein a content of the constituent unit derived from the epoxy-modified silicone B in the polymer D is from 20 to 60 mass % based on a total mass of the polymer D.
9. The curable composition according to claim 7, wherein an alkenyl group mol equivalent of the polymer D is from 300 to 1500 g/mol.
10. The curable composition according to claim 7, wherein
a content of the polymer D is from 5 to 50 mass % based on 100 mass % of resin solids.
11. The curable composition according to claim 1, further comprising a thermosetting resin E.
12. The curable composition according to claim 11, wherein
the thermosetting resin E contains one or more selected from the group consisting of a maleimide compound, a cyanate ester compound, a phenolic compound, an alkenyl-substituted nadimide compound, and an epoxy compound.
13. The curable composition according to claim 12, wherein
the maleimide compound includes one or more selected from the group consisting of bis(4-maleimidophenyl) methane, 2,2-bis{4-(4-maleimidophenoxy)-phenyl}propane, bi s(3-ethyl-5-methyl-4-maleimidophenyl)methane, and maleimide compounds represented by Formula (3):

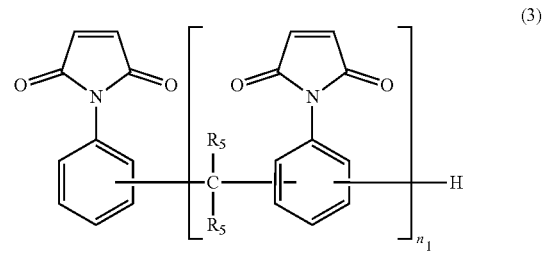

where each $R_5$ independently represents a hydrogen atom or a methyl group; and $n_1$ represents an integer of 1 or larger.
14. The curable composition according to claim 12, wherein
the cyanate ester compound comprises a compound represented by Formula (4) and/or a compound represented by Formula (5) excluding the compound represented by Formula (4):

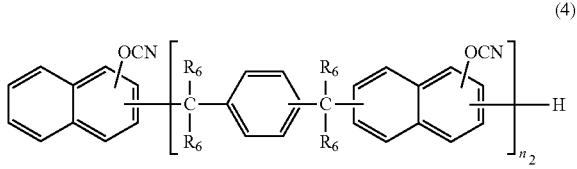

where each $R_6$ independently represents a hydrogen atom or a methyl group; and $n_2$ represents an integer of 1 or larger; and

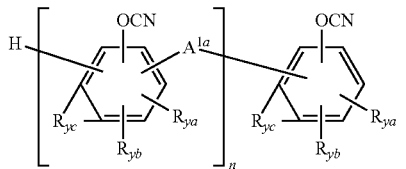

where each $R_{ya}$ independently represents an alkenyl group having from 2 to 8 carbon atoms; each $R_{yb}$ independently represents an alkyl group having from 1 to 10 carbon atoms, or a hydrogen atom; each $R_{yc}$ independently represents an aromatic ring having from 4 to 12 carbon atoms, where $R_{yc}$ may form a fused structure with a benzene ring, and $R_{yc}$ may be present or absent; each $A^{1a}$ independently represents an alkylene group having from 1 to 6 carbon atoms, an aralkylene group having from 7 to 16 carbon atoms, an arylene group having from 6 to 10 carbon atoms, a fluorenylidene group, a sulfonyl group, an oxygen atom, a sulfur atom, or a single bond;

when $R_{yc}$ is absent, one benzene ring may have two or more groups of $R_{ya}$ and/or $R_{yb}$; and n represents an integer from 1 to 10.

15. The curable composition according to claim 12, wherein
the epoxy compound includes a compound represented by Formula (6) or a compound represented by Formula (7):

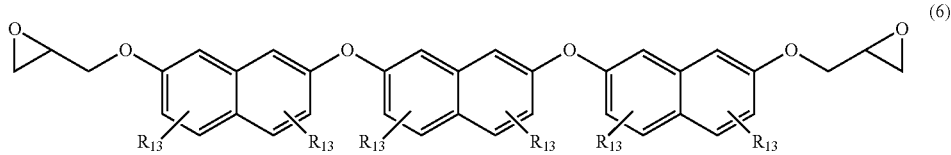

where each $R_{13}$ independently represents a hydrogen atom, an alkyl group having from 1 to 3 carbon atoms, or an alkenyl group having from 2 to 3 carbon atoms; and

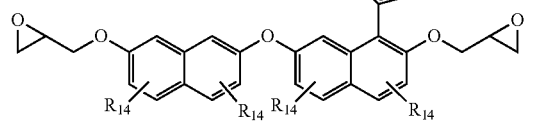

where each $R_{14}$ independently represents a hydrogen atom, an alkyl group having from 1 to 3 carbon atoms, or an alkenyl group having from 2 to 3 carbon atoms.

16. The curable composition according to claim 1, further including an inorganic filler, wherein
a content of the inorganic filler is from 50 to 1000 parts by mass based on 100 parts by mass of resin solids.

17. The curable composition according to claim 1, wherein
the curable composition is used for a printed wiring board.

18. A prepreg comprising:
a base material; and
the curable composition described in claim 1 with which the base material is impregnated or coated.

19. A resin sheet comprising:
a support; and
the curable composition described in claim 1 disposed on a surface of the support.

20. A metal foil-clad laminate comprising:
a laminate formed of one or more selected from the group consisting of:
the prepreg described in claim 18; and
a resin sheet comprising:
a support; and
the curable composition disposed on a surface of the support; and
a metal foil disposed on one or both sides of the laminate.

21. A printed wiring board comprising:
an insulating layer formed of one or more selected from the group consisting of:
the prepreg described in claim 18; and
a resin sheet comprising:
a support; and
the curable composition disposed on a surface of the support; and
a conductor layer formed on a surface of the insulating layer.

22. The curable composition according to claim 7, further comprising a thermosetting resin E.

23. The curable composition according to claim 22, wherein the thermosetting resin E contains one or more selected from the group consisting of a maleimide compound, a cyanate ester compound, a phenolic compound, an alkenyl-substituted nadimide compound, and an epoxy compound.

24. The curable composition according to claim 23, wherein the maleimide compound includes one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, and maleimide compounds represented by Formula (3):

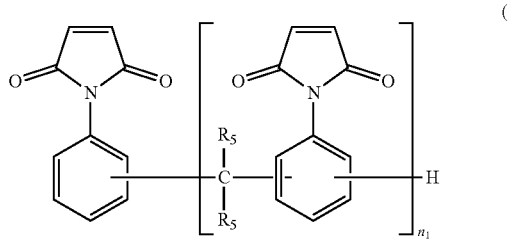

(3)

where each $R_5$ independently represents a hydrogen atom or a methyl group; and $n_1$ represents an integer of 1 or larger.

25. The curable composition according to claim 23, wherein the cyanate ester compound comprises a compound represented by Formula (4) and/or a compound represented by Formula (5) excluding the compound represented by Formula (4):

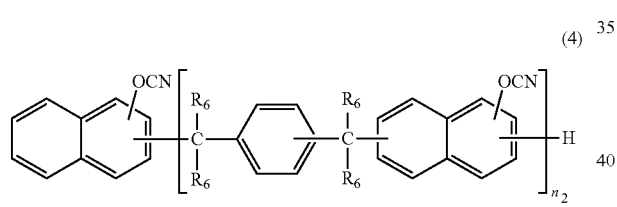

(4)

where each $R_6$ independently represents a hydrogen atom or a methyl group; and $n_2$ represents an integer of 1 or larger; and

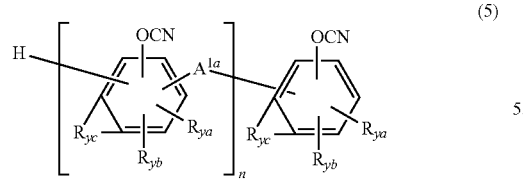

(5)

where each $R_{ya}$ independently represents an alkenyl group having from 2 to 8 carbon atoms; each $R_{yb}$ independently represents an alkyl group having from 1 to 10 carbon atoms, or a hydrogen atom; each $R_{yc}$ independently represents an aromatic ring having from 4 to 12 carbon atoms, where $R_{yc}$ may form a fused structure with a benzene ring, and $R_{yc}$ may be present or absent;

each $A_{1a}$ independently represents an alkylene group having from 1 to 6 carbon atoms, an aralkylene group having from 7 to 16 carbon atoms, an arylene group having from 6 to 10 carbon atoms, a fluorenylidene group, a sulfonyl group, an oxygen atom, a sulfur atom, or a single bond;

when $R_{yc}$ is absent, one benzene ring may have two or more groups of $R_{ya}$ and/or $R_{yb}$; and n represents an integer from 1 to 10.

26. The curable composition according to claim 23, wherein the epoxy compound includes a compound represented by Formula (6) or a compound represented by Formula (7):

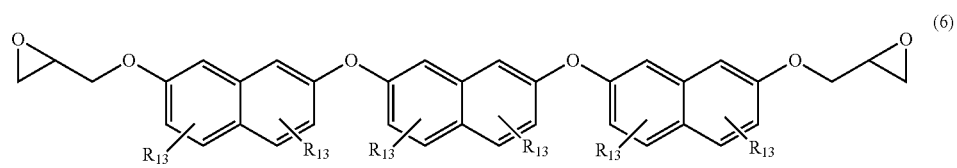

(6)

where each $R_{13}$ independently represents a hydrogen atom, an alkyl group having from 1 to 3 carbon atoms, or an alkenyl group having from 2 to 3 carbon atoms; and

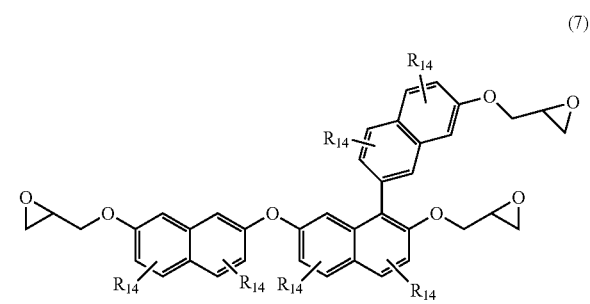

(7)

where each $R_{14}$ independently represents a hydrogen atom, an alkyl group having from 1 to 3 carbon atoms, or an alkenyl group having from 2 to 3 carbon atoms.

27. The curable composition according to claim 7, further including an inorganic filler, wherein a content of the inorganic filler is from 50 to 1000 parts by mass based on 100 parts by mass of resin solids.

28. A prepreg comprising:
a base material; and
the curable composition of claim 7 with which the base material is impregnated or coated.

29. A resin sheet comprising:
a support; and
the curable composition of claim 7 disposed on a surface of the support.

30. A metal foil-clad laminate comprising:
a laminate formed of the prepreg described in claim 28, and
a metal foil disposed on one or both sides of the laminate.

31. A printed wiring board comprising:
an insulating layer formed of the prepreg described in claim 28 and
a conductor layer formed on a surface of the insulating layer.

* * * * *